United States Patent
Eguchi

(10) Patent No.: US 9,218,855 B2
(45) Date of Patent: Dec. 22, 2015

(54) SEMICONDUCTOR DEVICE AND MEMORY CONTROL METHOD

(71) Applicant: SOCIONEXT INC., Yokohama, Kanagawa (JP)

(72) Inventor: Yasuyuki Eguchi, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 95 days.

(21) Appl. No.: 14/028,249

(22) Filed: Sep. 16, 2013

(65) Prior Publication Data

US 2014/0078850 A1 Mar. 20, 2014

(30) Foreign Application Priority Data

Sep. 20, 2012 (JP) .................. 2012-207076

(51) Int. Cl.
| | |
|---|---|
| *G11C 5/14* | (2006.01) |
| *G11C 8/00* | (2006.01) |
| *H03K 17/22* | (2006.01) |
| *G11C 7/22* | (2006.01) |

(52) U.S. Cl.
CPC ...... *G11C 5/14* (2013.01); *G11C 5/148* (2013.01); *G11C 7/22* (2013.01); *G11C 8/00* (2013.01); *H03K 17/22* (2013.01)

(58) Field of Classification Search
CPC ............ G11C 5/14; G11C 8/00; G11C 5/148; G11C 7/22
USPC .................................................. 365/227, 228
See application file for complete search history.

(56) References Cited

U.S. PATENT DOCUMENTS

| | | | | |
|---|---|---|---|---|
| 5,475,848 | A * | 12/1995 | Ikeda ............................ | 713/322 |
| 5,606,343 | A * | 2/1997 | Tsuboyama et al. ........... | 345/97 |
| 5,835,435 | A * | 11/1998 | Bogin et al. .................. | 365/227 |
| 6,073,244 | A * | 6/2000 | Iwazaki ........................ | 713/322 |
| 6,590,829 | B2 * | 7/2003 | Takeuchi ................... | 365/233.5 |
| 6,741,507 | B2 | 5/2004 | Iwamoto | |
| 6,948,029 | B2 * | 9/2005 | Yano ............................ | 711/106 |
| 7,398,406 | B2 | 7/2008 | Naruse et al. | |
| 8,001,343 | B2 * | 8/2011 | Kassai ......................... | 711/162 |
| 2006/0156075 | A1 * | 7/2006 | Mitsuishi ....................... | 714/51 |
| 2014/0040650 | A1 * | 2/2014 | Hida et al. ................... | 713/324 |

FOREIGN PATENT DOCUMENTS

| | | | |
|---|---|---|---|
| JP | 2003-272380 A | | 9/2003 |
| JP | 2005-339310 A | | 12/2005 |
| JP | 2008-217147 A | | 9/2008 |

* cited by examiner

*Primary Examiner* — Viet Q Nguyen
(74) *Attorney, Agent, or Firm* — Arent Fox LLP

(57) ABSTRACT

An access detection section detects access to an access object circuit and outputs a signal which restricts switching the access object circuit from a first operation state to a second operation state (low power consumption operation state) in which power consumption is lower than power consumption in the first operation state (normal operation state) until no-access period which lasts from last access to next access reaches a first period. An operation control section controls operation of the access object circuit according to the output of the access detection section.

9 Claims, 38 Drawing Sheets

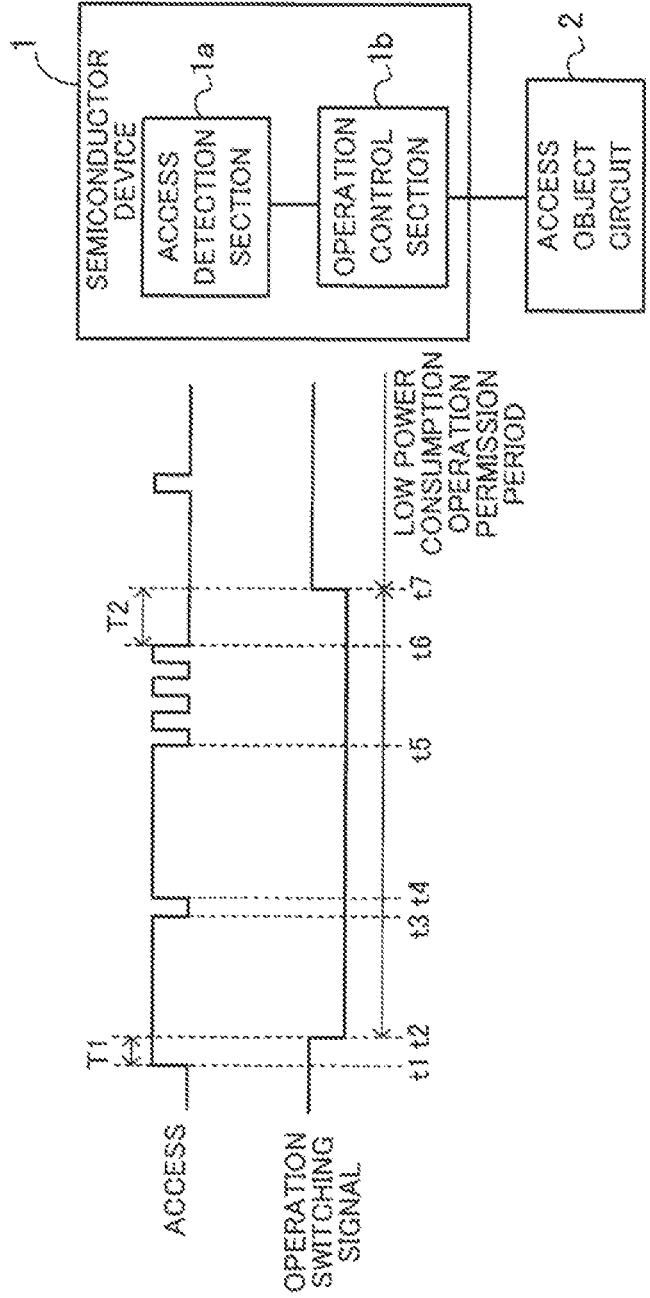

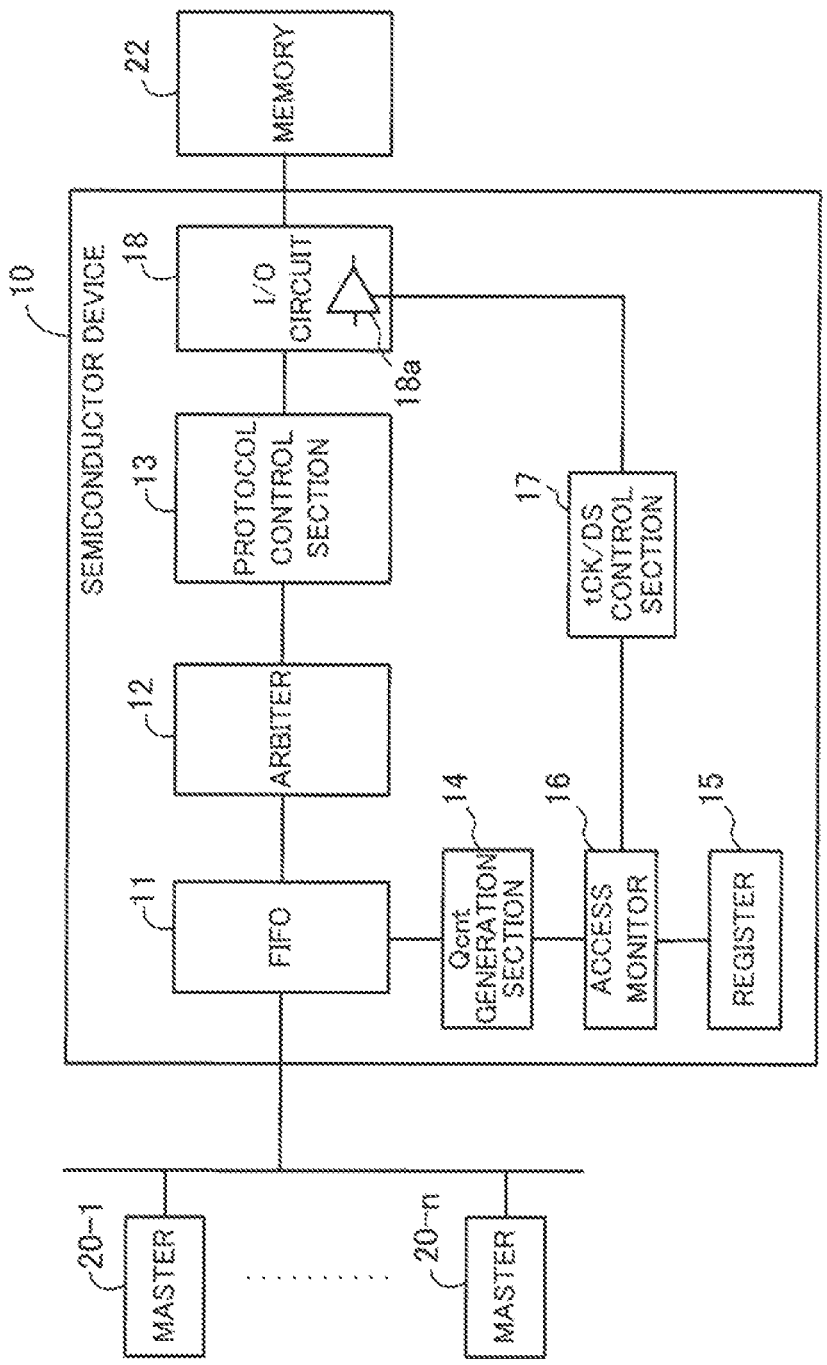

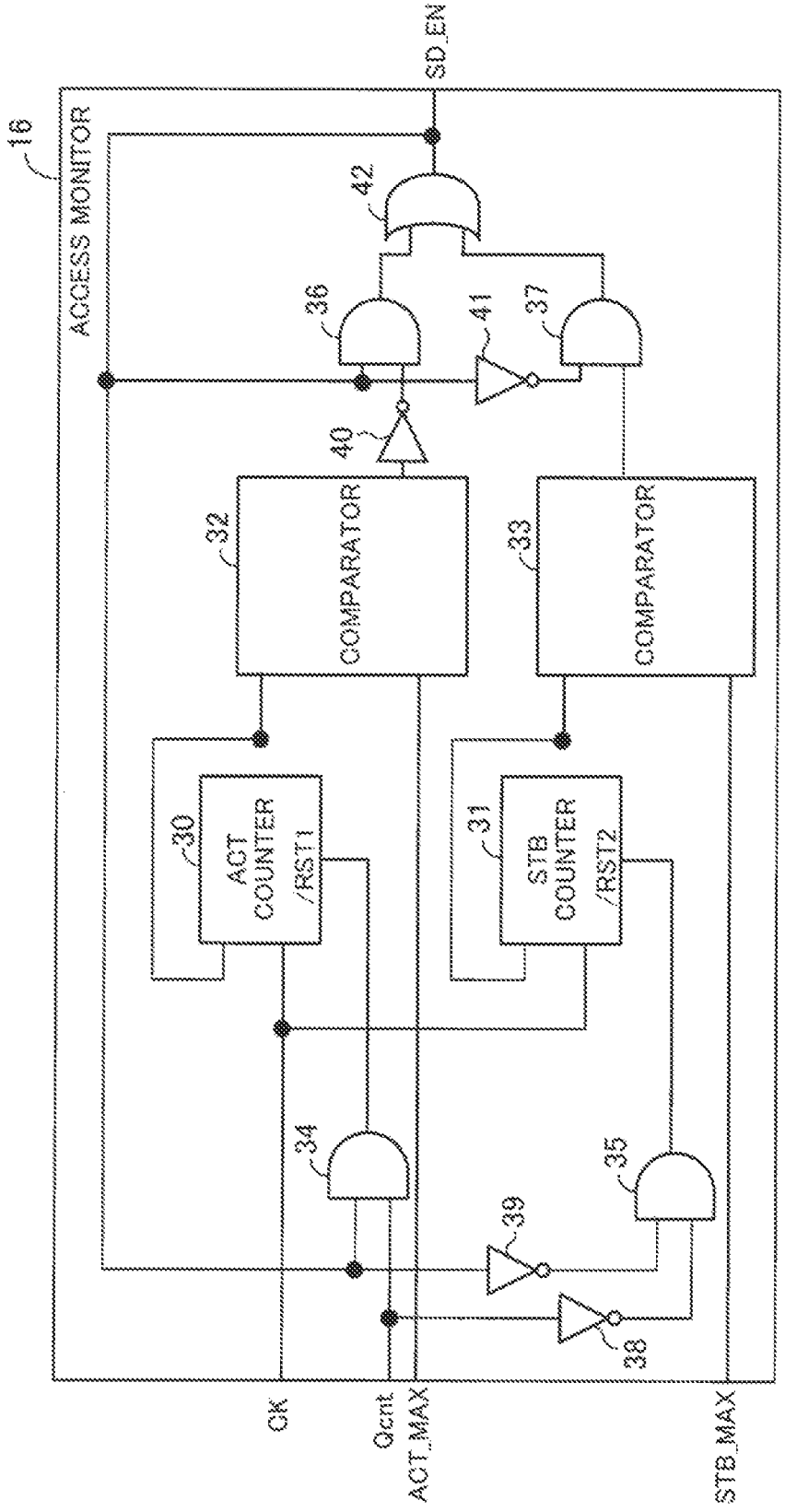

FIG. 4

| CURRENT OPERATION STATE | NORMAL OPERATION STATE | | | | LOW POWER CONSUMPTION OPERATION STATE | | | |
|---|---|---|---|---|---|---|---|---|
| SD_EN | 0 | 0 | 0 | 0 | 1 | 1 | 1 | 1 |
| ACT_OUT | 0 | 0 | 1 | 1 | 0 | 0 | 1 | 1 |
| STB_OUT | 0 | 1 | 0 | 1 | 0 | 1 | 0 | 1 |
| NEXT OPERATION STATE | NORMAL OPERATION STATE | LOW POWER CONSUMPTION OPERATION STATE | NORMAL OPERATION STATE | LOW POWER CONSUMPTION OPERATION STATE | LOW POWER CONSUMPTION OPERATION STATE | LOW POWER CONSUMPTION OPERATION STATE | NORMAL OPERATION STATE | NORMAL OPERATION STATE |
| SD_EN | 0 | 1 | 0 | 1 | 1 | 1 | 0 | 0 |

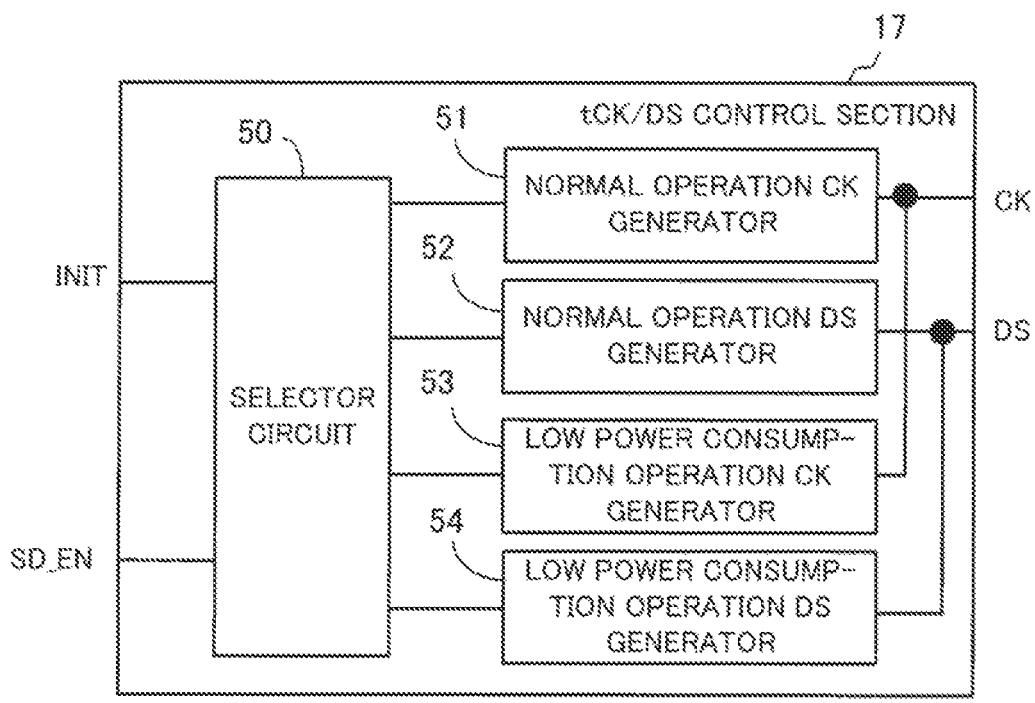

FIG. 6

|  | NORMAL OPERATION STATE | | LOW POWER CONSUMPTION OPERATION STATE | |
|---|---|---|---|---|
| SD_EN | 0 | 0 | 1 | 1 |
| INIT | 0 | 1 | 0 | 1 |
| CK | NORMAL OPERATION tCK | NORMAL OPERATION tCK | LOW POWER CONSUMPTION OPERATION tCK | NORMAL OPERATION tCK |
| DS | NORMAL OPERATION DS | NORMAL OPERATION DS | LOW POWER CONSUMPTION OPERATION DS | NORMAL OPERATION DS |

FIG. 12

| CURRENT OPERATION STATE | NORMAL OPERATION STATE | | | LOW POWER CONSUMPTION OPERATION STATE | | |
|---|---|---|---|---|---|---|
| SD_EN | 0 | 0 | 0 | 1 | 1 | 1 |
| Verify | 0 | 0 | 1 | 0 | 0 | 1 |
| STB_OUT | 0 | 1 | 1 | 0 | 1 | 1 |
| NEXT OPERATION STATE | NORMAL OPERATION STATE | LOW POWER CONSUMPTION OPERATION STATE | NORMAL OPERATION STATE | LOW POWER CONSUMPTION OPERATION STATE | LOW POWER CONSUMPTION OPERATION STATE | NORMAL OPERATION STATE |
| SD_EN | 0 | 1 | 0 | 1 | 1 | 0 |

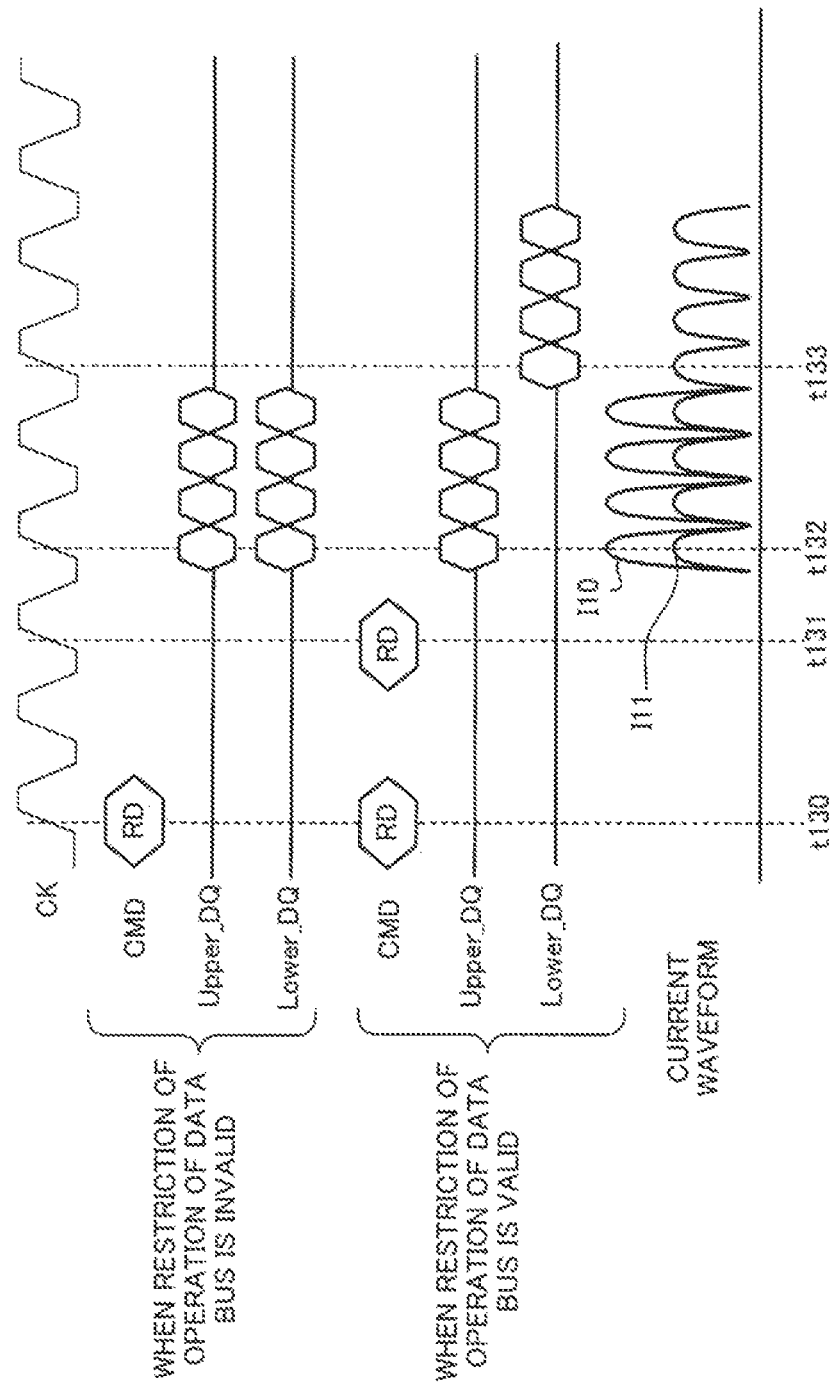

SEMICONDUCTOR DEVICE AND MEMORY CONTROL METHOD

CROSS-REFERENCE TO RELATED APPLICATION

This application is based upon and claims the benefit of priority of the prior Japanese Patent Application No. 2012-207076, filed on Sep. 20, 2012, the entire contents of which are incorporated herein by reference.

FIELD

The embodiments discussed herein are related to a semiconductor device and a memory control method.

BACKGROUND

When a transition between a normal operation state and a standby state in which power consumption is lower than power consumption in the normal operation state is made in a semiconductor device, there is a possibility that a significant drop in voltage caused by a change in load will lead to malfunction.

Accordingly, when a transition between a power-on reset period or a standby state and a normal operation state is made, the adoption of the technique of, for example, changing a frequency of a clock signal step by step for preventing a sudden change in power supply current is proposed.

Japanese Laid-open Patent Publication No. 2005-339310
Japanese Laid-open Patent Publication No. 2003-272380

However, access to a circuit the operation state of which is controlled takes various forms. If an operation state is not controlled according to actual access, then a malfunction may occur in the circuit. For example, if access to a circuit is frequently interrupted and a low power consumption operation state, such as a standby state, and a normal operation state are frequently repeated, then a malfunction may occur in the circuit due to power supply noise.

SUMMARY

According to an aspect, there is provided a semiconductor device including an access detection section which detects access to an access object circuit and which outputs a first signal which restricts switching the access object circuit from a first operation state to a second operation state in which power consumption is lower than power consumption in the first operation state until no-access period which lasts from last access to next access reaches a first period, and an operation control section which controls operation of the access object circuit according to the output of the access detection section.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 indicates an example of a semiconductor device according to a first embodiment and an example of its operation;

FIG. 2 indicates an example of a semiconductor device according to a second embodiment;

FIG. 3 indicates an example of an access monitor;

FIG. 4 is a truth table indicative of an example of the operation of the access monitor;

FIG. 5 indicates an example of a tCK/DS control section;

FIG. 6 is a truth table indicative of an example of the operation of the tCK/DS control section;

FIG. 12 is a truth table indicative of an example of the operation of the access monitor;

FIG. 38 is a timing chart of an example of operation at the time of restriction of the operation of a data bus being valid and invalid.

DESCRIPTION OF EMBODIMENTS

Figure 7:
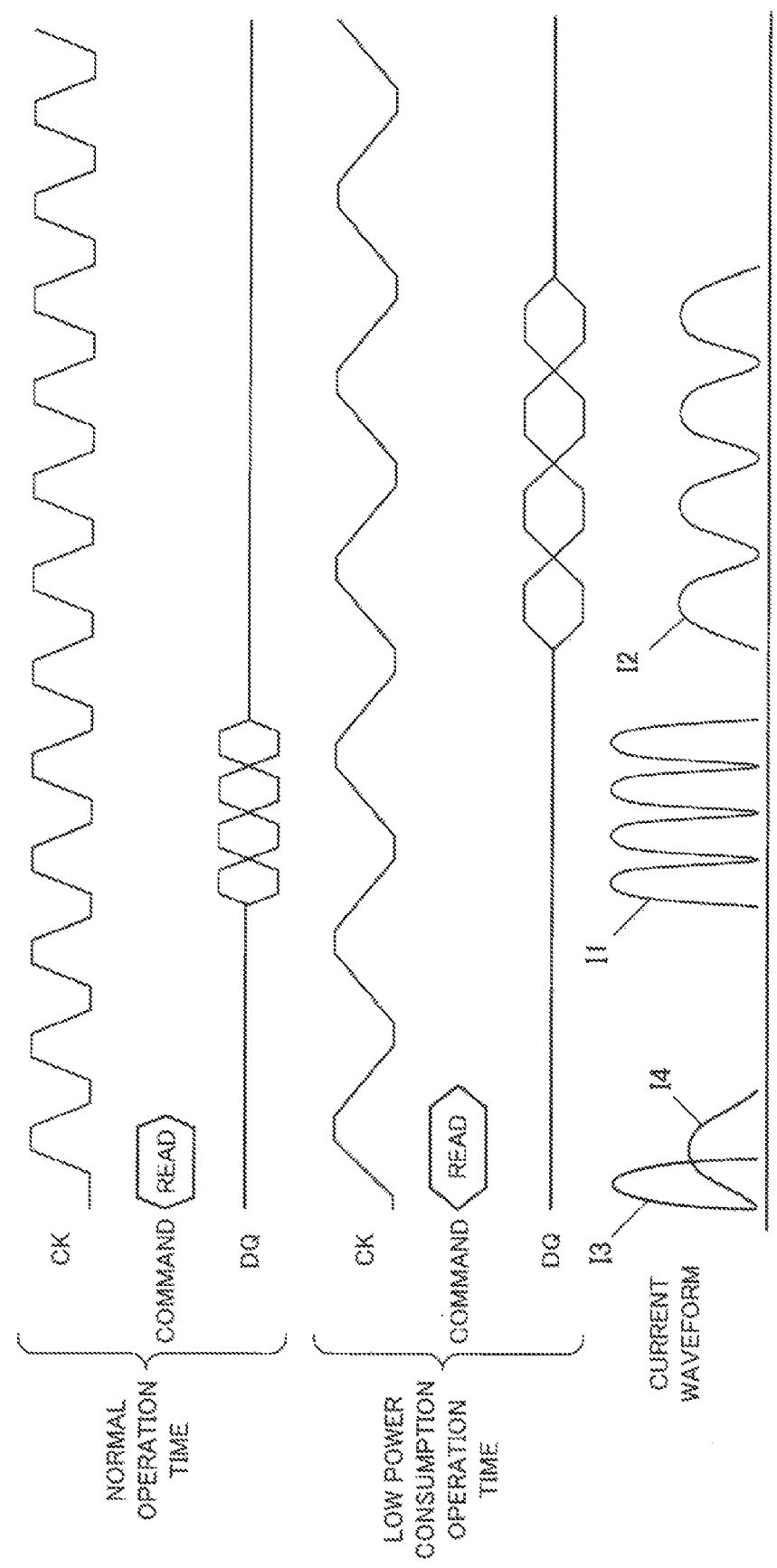
FIG. 7 indicates examples of a clock signal, a data signal, and a current waveform at normal operation time and low power consumption operation time.

Embodiments will now be described with reference to the accompanying drawings, wherein like reference numerals refer to like elements throughout.

(First Embodiment)

FIG. 1 indicates an example of a semiconductor device according to a first embodiment and an example of its operation.

A semiconductor device 1 includes an access detection section 1a and an operation control section 1b.

The access detection section 1a detects access to an access object circuit 2 and transmits to the operation control section 1b an operation switching signal corresponding to the access. Until no-access lasts for a determined period, the access detection section a outputs as an operation switching signal a signal by which switching the access object circuit 2 to a second operation state in which power consumption is lower than power consumption in a first operation state is restricted. The access object circuit 2 is, for example, a memory.

Furthermore, when the access object circuit 2 is in the second operation state, the access detection section 1a outputs as an operation switching signal a signal by which switching the access object circuit 2 to the first operation state is restricted until a determined condition is met.

Hereinafter the first and second operation states will be referred to as a normal operation stare and a low power consumption operation state respectively.

The operation control section 1b controls the operation of the access object circuit 2 on the basis of a signal from the access detection section 1a.

An example of the operation of the semiconductor device 1 will now be described by the use of a timing chart of FIG. 1. The timing chart indicates the presence or absence of access to the access object circuit 2 ("1" (H (High) level) indicates that access to the access object circuit 2 occurs, and "0" (L (Low) level) indicates that access to the access object circuit 2 does not occur). Furthermore, the timing chart indicates an example of an operation switching signal outputted from the access detection section 1a.

When the operation switching signal is "1", low power consumption operation is permitted and switching to a normal operation state is restricted. When the operation switching signal is "0", normal operation is permitted and switching to a low power consumption operation state is restricted.

As indicated in FIG. 1, when the operation switching signal is "1" and access occurs (at timing t1), the access detection section 1a keeps the operation switching signal at "1" until, for example, the access continues for a determined period T1. As a result, the operation control section 1b restricts the switching of the access object circuit 2 to the normal operation state. In addition, at this time a clock frequency is made lower than a clock frequency in the normal operation state or driver capability is made lower than driver capability in the normal operation state in order to realize a low power consumption operation state. Alternatively, verify is performed. That is to say, operation which consumes less power than normal operation is performed. This controls a change in voltage caused by a change in load which occurs at the time of a transition to the normal operation state.

When the access continues for the determined period T1, the access detection section 1a makes the operation switching signal "0" (at timing t2). As a result, the operation control section 1b permits the access object circuit 2 to perform normal operation. Accordingly, normal operation is performed according to the access.

At timing t3 the access is interrupted. However, until a no-access period lasts for a determined period T2, the access detection section 1a keeps the operation switching signal at "0" and restricts the switching of the access object circuit 2 to the low power consumption operation state.

At timing t4 the access occurs again. The access is frequently interrupted from timing t5 to t6. In this case, a no-access period does not last for the determined period T2. Accordingly, the access detection section 1a keeps the operation switching signal at "C" and restricts the switching of the access object circuit 2 to the low power consumption operation state.

After a no-access period lasts for the determined period T2, the access detection section 1a makes the operation switching signal "1" (at timing t7). As a result, the operation control section 1b permits the access object circuit 2 to go into the low power consumption operation state.

As has been described, with the semiconductor device 1 according to the first embodiment the access detection section 1a restricts the switching of the access object circuit 2 from the normal operation state to the low power consumption operation state until a no-access period lasts for a determined period. This prevents frequent switching between the normal operation state and the low power consumption operation state based on the presence or absence of access. As a result, the occurrence of a malfunction in the access object circuit 2 caused by power supply noise or the like can be prevented.

Furthermore, with the semiconductor device 1 according to the first embodiment the access detection section 1a restricts the switching of the access object circuit 2 in the low power consumption operation state from the low power consumption operation state to the normal operation state until an access period lasts for a determined period. This prevents frequent switching between the normal operation state and the low power consumption operation state based on the presence or absence of access. As a result, the occurrence of a malfunction in the access object circuit 2 caused by power supply noise or the like can be prevented.

(Second Embodiment)

FIG. 2 indicates an example of a semiconductor device according to a second embodiment.

A semiconductor device 10 is a memory controller and includes an FIFO (First-In-First-Out) 11, an arbiter 12, a protocol control section 13, a Qcnt generation section 14, a register 15, an access monitor 16, a tCK/DS control section 17, and an I/O (Input/Output) circuit 18.

The semiconductor device 10 according to the second embodiment uses the access monitor 16 for carrying out the function of the access detection section 1a illustrated in FIG. 1, and uses the tCK/DS control section 17 for carrying out the function of the operation control section 1b illustrated in FIG. 1. Furthermore, in the second embodiment a memory 22 is an access object circuit.

The FIFO 11 holds commands and the like from masters 20-1 through 20-n. The arbiter 12 determines, for example, which of the masters 20-1 through 20-n has priority on access to the memory 22. The protocol control section 13 performs a process corresponding to a protocol for the memory 22. For example, the protocol control section 13 transmits a command to the memory 22 with latency corresponding to the protocol.

The Qcnt generation section 14 detects whether or not the FIFO 11 holds an external command, and generates a signal Qcnt indicative of the presence or absence of access to the memory 22. In the following description it is assumed that if there is access to the memory 22, then Qcnt=1 (H level) and that if there is no access to the memory 22, then Qcnt=0 (L level).

The register 15 holds values indicative of a threshold period for a transition from low power consumption operation to normal operation and a threshold period for a transition from normal operation to low power consumption operation. In this embodiment two upper limit values for count values of two counters which are included in the access monitor 16 and which will be described later are held in order to determine the threshold periods.

The access monitor 16 generates, according to the signal Qcnt and a threshold period, a signal SD_EN indicative of whether low power consumption operation is made valid or invalid. In the following description it is assumed that if low power consumption operation is made valid, then SD_EN=1 and that if low power consumption operation is made invalid, then SD_EN=0. The access monitor 16 refers to the signal Qcnt. If there is no access for a threshold period, then the access monitor 16 makes SD_EN "1". If access continues for a threshold period, then the access monitor 16 makes SD_EN "0".

The tCK/DS control section 17 generates a clock signal CK and a driver capability setting signal DS corresponding to the signal SD_EN. The tCK/DS control section 17 then supplies the generated clock signal CK to each section of the semiconductor device 10. Furthermore, the tCK/DS control section 17 supplies the generated driver capability setting signal DS to the I/O circuit 18 including an output driver 18a. In addition, the driver capability setting signal DS may be supplied to a transistor included in the semiconductor device 10. For example, when SD_EN=1, the tCK/DS control section 17 generates a clock signal CK the frequency of which is lower than the frequency of a clock signal CK generated at the time of SD_EN being 0, and generates a driver capability setting signal DS for specifying driver capability which is lower than driver capability specified at the time of SD_EN being 0.

A signal line for transmitting the clock signal CK to each section of the semiconductor device 10 is not illustrated.

For example, when power is applied, a signal INIT for initializing a cycle of the clock signal CK and the driver capability setting signal DS is supplied from a power-on reset circuit (not illustrated) or the like to the tCK/DS control section 17. When the signal INIT is "1", initialization is performed.

The I/O circuit 18 includes the output driver 18a and outputs a control signal and the like to the memory 22.

(Example of Access Monitor 16)

FIG. 3 indicates an example of the access monitor.

The access monitor 16 includes an ACT counter 30, an STB counter 31, comparators 32 and 33, AND circuits 34, 35, 36, and 37, inverters 38, 39, 40, and 41, and an OR circuit 42.

The ACT counter 30 and the STB counter 31 perform counting in synchronization with the clock signal CK. Furthermore, the ACT counter 30 and the STB counter 31 include reset terminals /RST1 and /RST2 respectively.

The comparator 32 compares a count value outputted from the ACT counter 30 and an upper limit value ACT_MAX for a count value of the ACT counter 30. The comparator 33 compares a count value outputted from the STB counter 31 and an upper limit value STB_MAX for a count value of the STB counter 31. If a count value outputted from the ACT counter 30 is greater than or equal to the upper limit value ACT_MAX, then the comparator 32 outputs "1". If a count value outputted from the ACT counter 30 is smaller than the upper limit value ACT_MAX, then the comparator 32 outputs "0". If a count value outputted from the STB counter 31 is greater than or equal to the upper limit value STB_MAX, then the comparator 33 outputs "1". If a count value outputted from the STB counter 31 is smaller than the upper limit value STB_MAX, then the comparator 33 outputs "0".

A signal Qcnt generated by the Qcnt generation section 14 is inputted to one input terminal of the AND circuit 34 and a signal SD_EN outputted from the access monitor 16 is inputted to the other input terminal of the AND circuit 34. An output terminal of the AND circuit 34 is connected to the reset terminal /RST1 of the ACT counter 30.

The signal Qcnt is inputted to one input terminal of the AND circuit 35 via the inverter 38 and the signal SD_EN is inputted to the other input terminal of the AND circuit 35 via the inverter 39. An output terminal of the AND circuit 35 is connected to the reset terminal /RST2 of the STB counter 31.

A signal outputted from the comparator 32 is inputted to one input terminal of the AND circuit 36 via the inverter 40 and the signal SD_EN is inputted to the other input terminal of the AND circuit 36. An output terminal of the AND circuit 36 is connected to one input terminal of the OR circuit 42.

A signal outputted from the comparator 33 is inputted to one input terminal of the AND circuit 37 and the signal SD_EN is inputted to the other input terminal of the AND circuit 37 via the inverter 41. An output terminal of the AND circuit 37 is connected to the other input terminal of the OR circuit 42. The signal SD_EN outputted from the access monitor 16 is outputted from an output terminal of the OR circuit 42.

(Example of Operation of Access Monitor 16)

First the operation of the ACT counter 30 will be described. When the signal SD_EN is "0", output from the AND circuit 34 is "0" regardless of a value of the signal Qcnt. The ACT counter 30 is in a reset state and outputs "0". When the signal SD_EN is "1" and the signal Qcnt is "0", the ACT counter 30 is in a reset state and outputs "0". When the signal SD_EN is "1" and the signal Qcnt is "1", output from the AND circuit 34 is "1" and the ACT counter 30 performs count-up operation in synchronization with the clock signal CK.

Next, the operation of the STB counter 31 will be described. When the signal SD_EN is "0" and the signal Qcnt is "0", output from the AND circuit 35 is "1" and the STB counter 31 performs count-up operation in synchronization with the clock signal CK. When the signal SD_EN is "0" and the signal Qcnt is "1" or when the signal SD_EN is "1", output from the AND circuit 35 is "0". The STB counter 31 is in a reset state and outputs "0".

FIG. 4 is a truth table indicative of an example of the operation of the access monitor. A signal ACT_OUT is outputted from the comparator 32. A signal STB_OUT is outputted from the comparator 33.

First a case where the memory 22 is currently in a normal operation state will be described. At this time the signal SD_EN is "0".

When the signal STB_OUT is "0", the signal SD_EN is "0" regardless of a value of the signal ACT_OUT and the next operation state is also the normal operation state. When the signal STB_OUT is "1", the signal SD_EN is "1" regardless of a value of the signal ACT_OUT and the memory 22 is in a low power consumption operation state.

Next, a case where the memory 22 is currently in the low power consumption operation state will be described. At this time the signal SD_EN is "1".

When the signal ACT_OUT is "0", the signal SD_EN remains at "1" regardless of a value of the signal STB_OUT and the next operation state is also the low power consumption operation state. When the signal ACT_OUT is "1", the signal. SD_EN is "0" regardless of a value of the signal STB_OUT and the memory 22 is in the normal operation state.

(Example of tCK/DS Control Section 17)

FIG. 5 indicates an example of the tCK/DS control section.

The tCK/DS control section 17 includes a selector circuit 50, a normal operation CK generator 51, a normal operation DS generator 52, a low power consumption operation CK generator 53, and a low power consumption operation DS generator 54.

The selector circuit 50 selects the normal operation CK generator 51, the normal operation DS generator 52, the low power consumption operation CK generator 53, or the low power consumption operation DS generator 54 which is to be made valid according to a signal INIT or SD_EN.

The normal operation CK generator 51 includes, for example, a frequency divider and generates a normal operation clock signal CK. The normal operation DS generator 52 generates a normal operation driver capability setting signal DS.

The low power consumption operation CK generator 53 includes, for example, a frequency divider and generates a low power consumption operation clock signal CK. A cycle tCK of the low power consumption operation clock signal CK is longer than a cycle tCK of the normal operation clock signal CK (that is to say, a frequency of the low power consumption operation clock signal CK is lower than a frequency of the normal operation clock signal CK). The low power consumption operation DS generator 54 generates a low power consumption operation driver capability setting signal DS. Driver capability specified by the low power consumption operation driver capability setting signal DS is lower than driver capability specified by the normal operation driver capability setting signal DS.

(Example of Operation of tCK/DS Control Section 17)

FIG. 6 is a truth table indicative of an example of the operation of the tCK/DS control section.

When the memory 22 is in a normal operation state, the signal SD_EN is "0". At this time the selector circuit 50 makes the normal operation CK generator 51 and the normal operation DS generator 52 valid and makes the low power consumption operation CK generator 53 and the low power consumption operation DS generator 54 invalid, regardless of a value of the signal INIT. As a result, a normal operation clock signal CK and a normal operation driver capability setting signal DS are generated.

When the memory 22 is in a low power consumption operation state, the signal SD_EN is "1". When the signal INIT is "0", the selector circuit 50 makes the low power consumption operation CK generator 53 and the low power consumption operation DS generator 54 valid and makes the normal operation CK generator 51 and the normal operation DS generator 52 invalid. As a result, a low power consumption operation clock signal CK and a low power consumption operation driver capability setting signal DS are generated.

Furthermore, when the signal INIT is "1", the selector circuit 50 makes the normal operation CK generator 51 and the normal operation DS generator 52 valid and makes the low power consumption operation CK generator 53 and the low power consumption operation DS generator 54 invalid. As a result, a normal operation clock signal CK and a normal operation driver capability setting signal DS are generated.

FIG. 7 indicates examples of a clock signal, a data signal, and a current waveform at normal operation time and low power consumption operation time.

FIG. 7 indicates examples of a clock signal CK, a data signal DQ, and the waveform of current consumed in the semiconductor device 10 and the memory 22 at the time of a read command being supplied to the FIFO 11 as a command.

The tCK/DS control section 17 exercises control so as to make the cycle of the clock signal CK at the low power consumption operation time longer than the cycle of the clock signal CK at the normal operation time. As a result, the data signal DQ is read out slowly from the memory 22 compared with the normal operation time. Accordingly, a peak value of a waveform I2 of current consumed in the memory 22 at the low power consumption operation time is lower than a peak value of a waveform I1 of current consumed in the memory 22 at the normal operation time.

In addition, driver capability in the semiconductor device 10 is limited at the low power consumption operation time. Therefore, a peak value and a slew rate (slope) of a waveform I4 of current consumed in the semiconductor device 10 at the low power consumption operation time are lower than a peak value and a slew rate, respectively, of a waveform I3 of current consumed in the semiconductor device 10 at the normal operation time.

(Example of Operation of Whole of Semiconductor Device 10)

Figure 8:
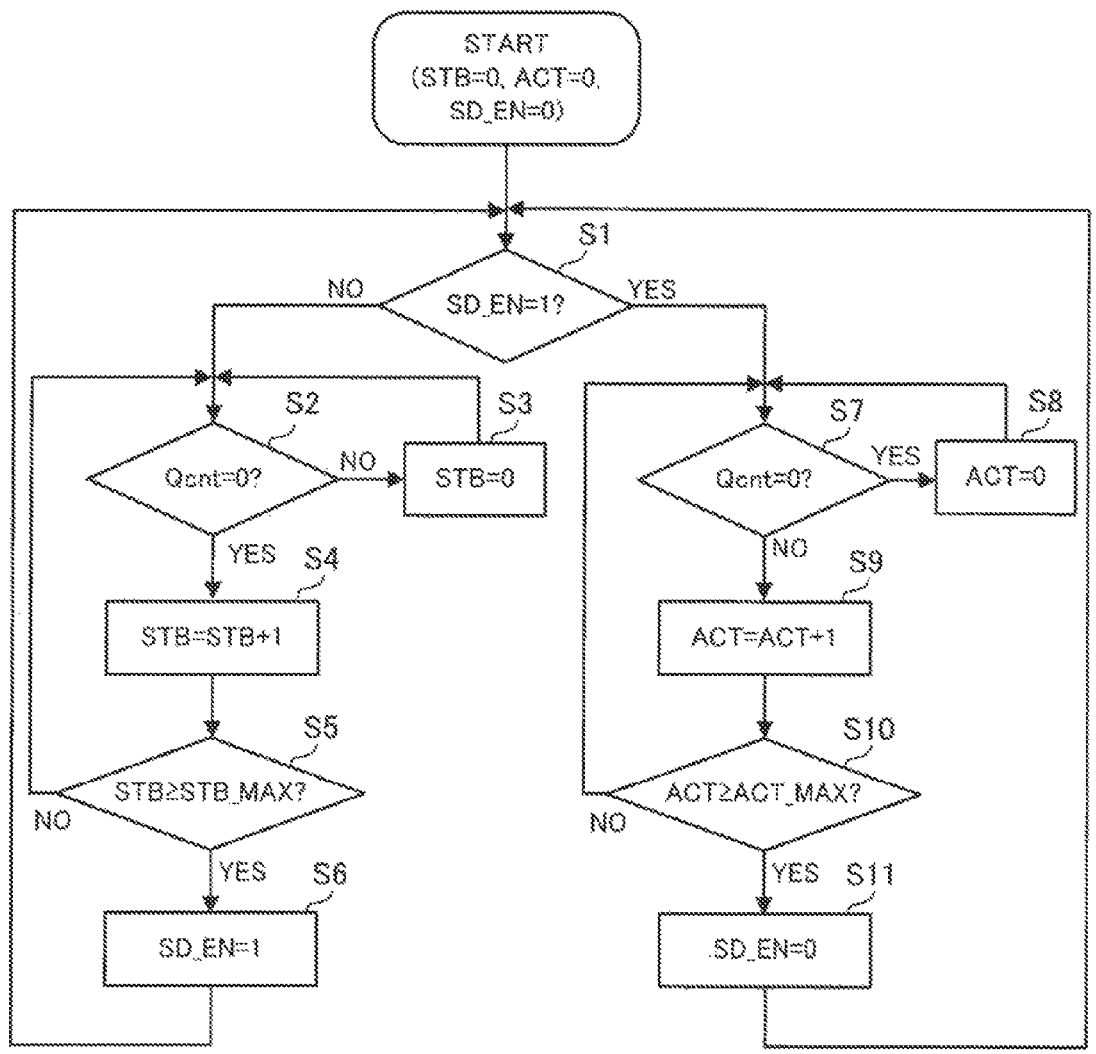
FIG. 8 is a flow chart of an example of the operation of the semiconductor device according to the second embodiment.

FIG. 8 is a flow chart of an example of the operation of the semiconductor device according to the second embodiment.

It is assumed that count values STB and ACT and a signal SD_EN are "0" at first.

The access monitor 16 determines whether or not the signal SD_EN is "1" (step S1). When the memory 22 is in a normal operation state, the signal SD_EN is "0". Accordingly, step S2 is performed. For example, when the memory 22 is in a low power consumption operation state, the signal SD_EN is "1". Accordingly, step S7 is performed.

The access monitor 16 determines in step S2 whether or not the signal Qcnt is "0". When a command is supplied to the FIFO 11 and access to the memory 22 occurs, the signal Qcnt becomes "1" and the STB counter 31 included in the access monitor 16 goes into a reset state. That is to say, the count value STB of the STB counter 31 becomes "0" (step S3). After that, a process is repeated from step S2.

When the FIFO 11 is in an empty state, the signal Qcnt is "0". The STB counter 31 included in the access monitor 16 performs count-up operation and therefore STB=STB+1 (step S4). The comparator 33 included in the access monitor 16 then compares the upper limit value STB_MAX and the count value STB (step S5). If STB<STB_MAX, then a process is repeated from step S2. If STB≥STB_MAX, then the access monitor 16 sets the signal SD_EN to "1" (step S6). As a result, a state in which low power consumption operation is permitted arises. Furthermore, if the signal INIT is not "1" at this time, the tCK/DS control section 17 generates a low power consumption operation clock signal CK with a cycle tCK and a low power consumption operation driver capability setting signal DS and supplies them to each section. After that, a process is repeated from step S1 until, for example, the supply of power is stopped.

On the other hand, if the signal SD_EN is "1" in step S1, then the access monitor 16 determines in step S7 whether or not the signal Qcnt is "0". When access to the memory 22 does not occur and the FIFO 11 is in an empty state, the signal Qcnt is "0" and the ACT counter 30 included in the access monitor 16 is in a reset state. That is to say, the count value ACT of the ACT counter 30 is "0" (step S8). After that, a process is repeated from step S7.

When a command is supplied to the FIFO 11 and access to the memory 22 occurs, the signal Qcnt becomes "1". The ACT counter 30 included in the access monitor 16 performs count-up operation and therefore ACT=ACT+1 (step S9). The comparator 32 included in the access monitor 16 then compares the upper limit value ACT_MAX and the count value ACT (step S10). If ACT<ACT_MAX, then a process is repeated from step S7. If ACT≥ACT_MAX, then the access monitor 16 sets the signal SD_EN to "0" (step S11). As a result, a state in which normal operation is permitted arises. Furthermore, at this time the tCK/DS control section 17 generates a normal operation clock signal CK with a cycle tCK and a normal operation driver capability setting signal DS and supplies them to each section. After that, a process is repeated from step S1 until, for example, the supply of power is stopped.

Figure 9:
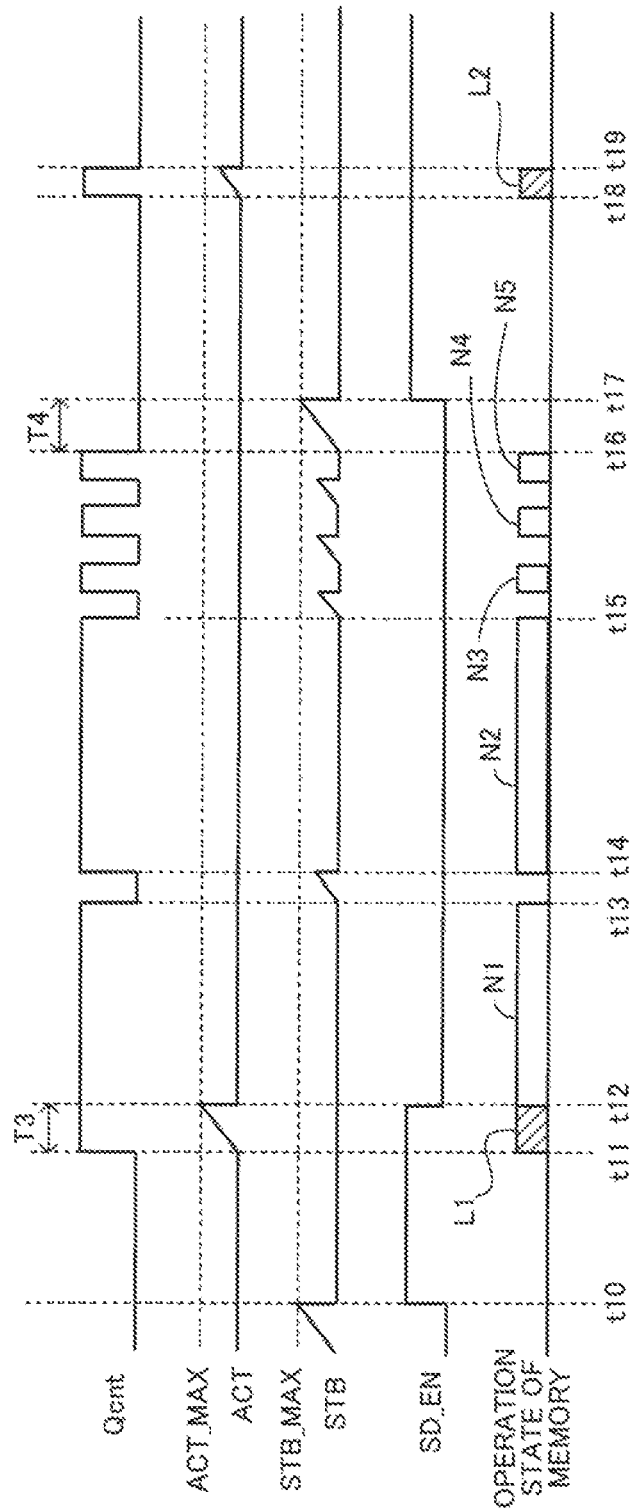
FIG. 9 is a timing chart of an example of the operation of the semiconductor device according to the second embodiment.

FIG. 9 is a timing chart of an example of the operation of the semiconductor device according to the second embodiment. FIG. 9 indicates examples of a signal Qcnt, a count value ACT of the ACT counter 30, a count value STB of the STB counter 31, a signal SD_EN, and an operation state of the memory 22. A clock signal CK is not indicated.

When the signal Qcnt is "0" in a state in which the signal SD_EN is "0", the STB counter 31 performs count-up operation in synchronization with the clock signal CK. When the count value STB reaches the upper limit value STB_MAX, the signal SD_EN becomes "1" (at timing t10). When the signal Qcnt becomes "1" in a state in which the signal SD_EN is "1", the memory 22 goes into a state L1 in which the memory 22 operates by a low power consumption operation clock signal CK with a cycle tCK and a low power consumption operation driver capability setting signal DS (at timing t11).

Furthermore, when the signal Qcnt becomes "1", the ACT counter 30 performs count-up operation in synchronization with the clock signal CK. When the count value ACT reaches the upper limit value ACT_MAX, the signal SD_EN becomes "0". As a result, the memory 22 goes into a state N1 in which the memory 22 operates by a normal operation clock signal CK with a cycle tCK and a normal operation driver capability setting signal DS (at timing t12). A period from the timing t11 to the timing t12 is a threshold period T3 for permitting a transition from a low power consumption operation state to a normal operation state. This threshold period T3 is determined by the cycle tCK of the clock signal CK and the upper limit value ACT_MAX.

As indicated in FIG. 9, the signal Qcnt becomes "0" at timing t13. However, the signal Qcnt returns to "1" at timing t14 at which the count value STB does not reach the upper limit value STB_MAX, so the signal SD_EN remains at "0". As a result, the memory 22 goes again into a state N2 in which the memory 22 performs normal operation at the timing t14 at which access occurs.

The signal Qcnt frequently becomes "0" and "1" from timing t15 to timing t16. At this time the count value STB does not reach the upper limit value STB_MAX, so the signal SD_EN remains at "0". Accordingly, while the signal Qcnt is "1", the memory 22 is in states N3, N4, and N5 in which the memory 22 performs normal operation.

When the count value STB reaches the upper limit value STB_MAX in a state in which the signal Qcnt is "0", the signal SD_EN becomes "1" (at timing t17). As a result, the memory 22 goes into a state L2 in which the memory 22 operates by a low power consumption operation clock signal CK with a cycle tCK and a low power consumption operation driver capability setting signal DS at timing t18 at which the signal Qcnt becomes "1". A period from the timing t16 to the timing t17 is a threshold period T4 for permitting a transition from a normal operation state to a low power consumption operation state. This threshold period T4 is determined by the cycle tCK of the clock signal CK and the upper limit value STB_MAX.

The signal Qcnt becomes "1" at the timing t18. As a result, the ACT counter 30 performs count-up operation in synchronization with the clock signal CK. However, the signal. Qcnt becomes "0" (at timing t19) before the count value ACT reaches the upper limit value ACT_MAX. Accordingly, the memory 22 does not make a transition to a normal operation state.

As has been described, the access monitor 16 restricts the switching of the memory 22 from a normal operation state to a low power consumption operation state until a no-access period lasts for a determined period (threshold period T4 in the example of FIG. 9). This prevents frequent switching between the normal operation state and the low power consumption operation state based on the presence or absence of access. As a result, the occurrence of a malfunction in the memory 22 caused by power supply noise or the like can be prevented.

Furthermore, when the memory 22 is in the low power consumption operation state, the access monitor 16 restricts the switching of the memory 22 from the low power consumption operation state to the normal operation state until an access period lasts for a determined period (threshold period T3 in the example of FIG. 9). This prevents frequent switching between the normal operation state and the low power consumption operation state based on the presence or absence of access. As a result, the occurrence of a malfunction in the memory 22 caused by power supply noise or the like can be prevented.

In addition, when the memory 22 makes a transition from the low power consumption operation state, such as a standby state, to the normal operation state, the semiconductor device 10 according to the second embodiment makes a cycle of a clock signal longer than a cycle of a clock signal at normal, operation time or makes driver capability lower than driver capability at normal operation time in order to realize low power consumption operation. This controls a change in voltage caused by a change in load which occurs at the time of a transition from the standby state to the normal operation state. Accordingly, the occurrence of a malfunction in the memory 22 can be prevented.

(Third Embodiment)

Figure 10:
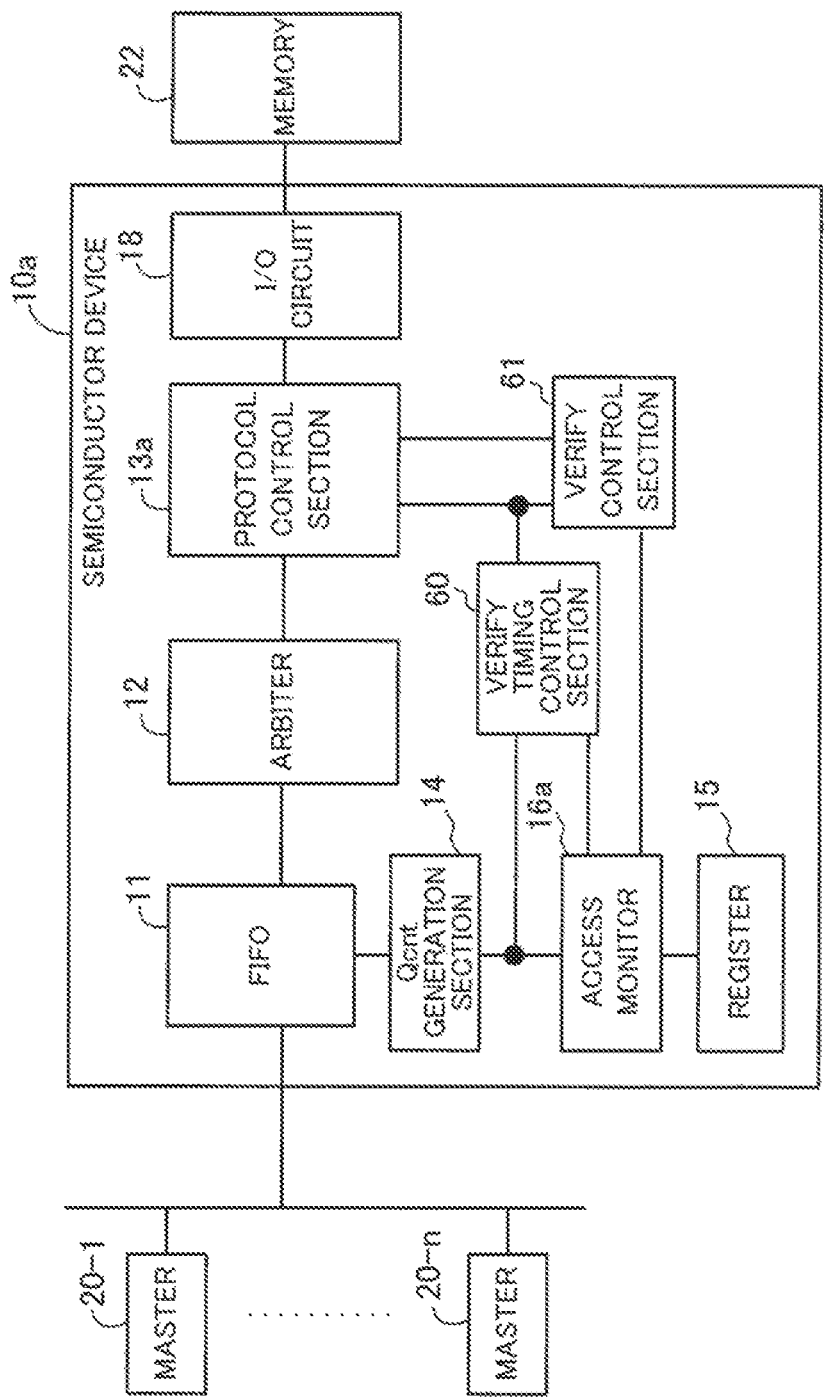
FIG. 10 indicates an example of a semiconductor device according to a third embodiment.

FIG. 10 indicates an example of a semiconductor device according to a third embodiment. Components in FIG. 10 which are the same as those included in the semiconductor device 10 according to the second embodiment illustrated in FIG. 2 are marked with the same numerals and description of them will be omitted.

When a memory 22 makes a transition from a low power consumption operation state to a normal operation state, a semiconductor device 10a verifies, for example, whether or not data is normally written to the memory 22. The semiconductor device 10a includes a verify timing control section 60 and a verify control section 61.

The verify timing control section 60 controls timing at which verify is performed. The verify control section 61 performs verify at timing designated by the verify timing control section 60, and outputs a verify result Verify to an access monitor 16a.

The access monitor 16a generates, according to a signal Qcnt, an upper limit value STB_MAX held in a register 15a, and a verify result Verify outputted from the verify control section 61, a signal SD_EN which indicates whether to make low power consumption operation valid or invalid. If the access monitor 16a acquires, at the time of the memory 22 being in the low power consumption operation state, a verify result Verify which indicates that correct write or read is performed, then the access monitor 16a makes a signal SD_EN 0 and permits the switching of the memory 22 to the normal operation state. In the following description it is assumed that a verify result which indicates that correct write or read is performed is Verify=1, and that a verify result which indicates that correct write or read is not performed is Verify=0.

(Example of Access Monitor 16a)

Figure 11:
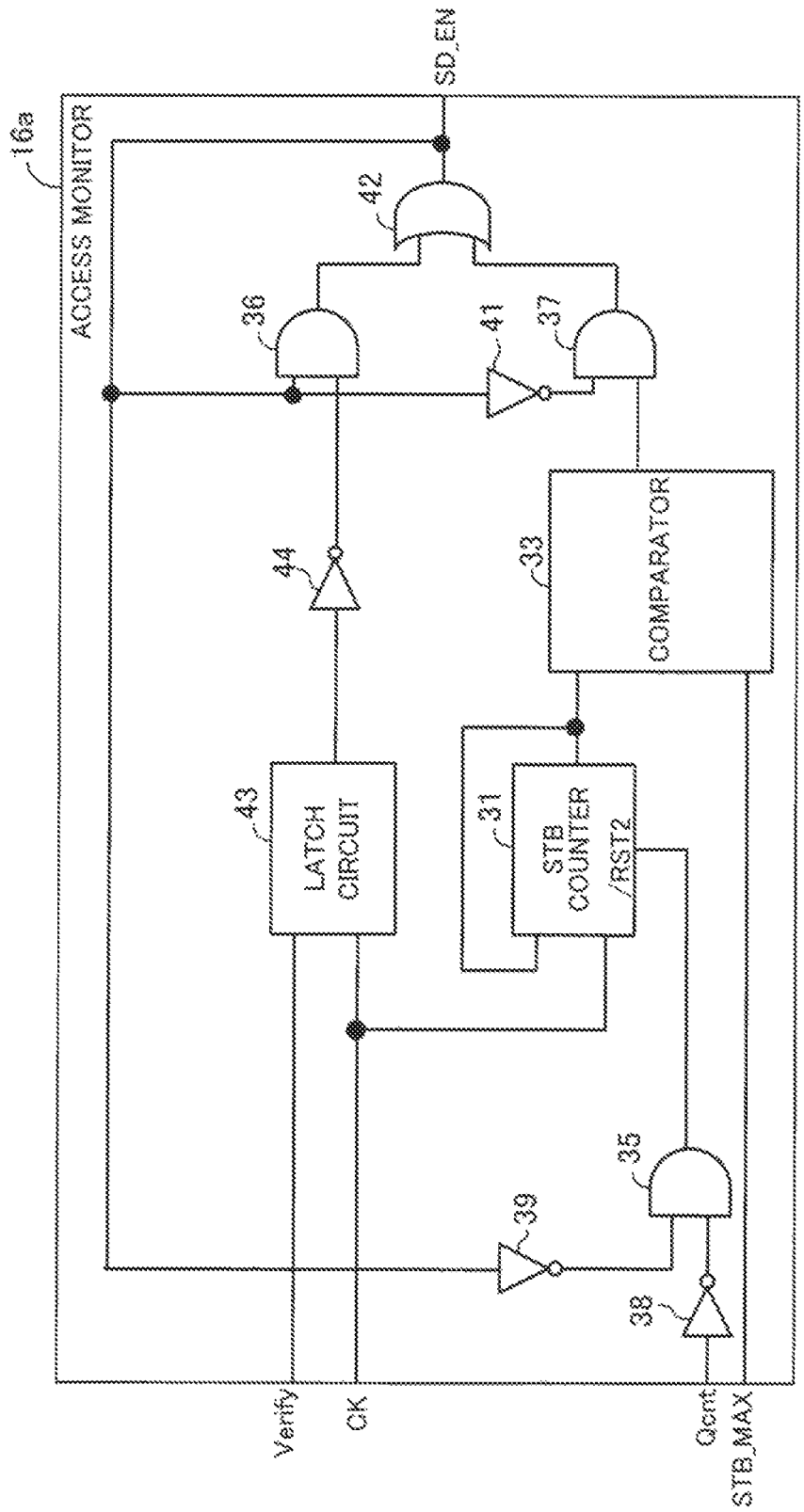
FIG. 11 is an example of an access monitor included in the semiconductor device according to the third embodiment.

FIG. 11 is an example of the access monitor included in the semiconductor device according to the third embodiment. Components in FIG. 11 which are the same as those included in the access monitor 16 illustrated in FIG. 3 are marked with the same numerals and description of them will be omitted.

The access monitor 16a included in the semiconductor device 10a according to the third embodiment includes a latch circuit 43 which holds a verify result Verify outputted from the verify control section 61 in synchronization with a clock signal CK supplied from a clock signal generator (not illustrated). An output terminal of the latch circuit 43 is connected to an input terminal of an inverter 44 and an output terminal of the inverter 44 is connected to one input terminal of an AND circuit 36. A signal SD_EN outputted from the access monitor 16a is inputted to the other input terminal of the AND circuit 36. An output terminal of the AND circuit 36 is connected to one input terminal of an OR circuit 42.

FIG. 12 is a truth table indicative of an example of the operation of the access monitor.

First a case where the memory 22 is currently in the normal operation state will be described. At this time the signal SD_EN is "0".

When a signal STB_OUT outputted from a comparator 33 is "0", the next operation state is also the normal operation state regardless of a value of a verify result Verify and the signal SD_EN remains at "0". When the signal STB_OUT becomes "1", the signal SD_EN which makes low power consumption operation valid becomes "1" regardless of a value of the verify result Verify and the memory 22 goes into a low power consumption operation state.

Next, a case where the memory 22 is currently in the low power consumption operation state will be described. At this time the signal SD_EN is "1".

If the verify result Verify is "0", the signal SD_EN remains at "1" regardless of a value of the signal STB_OUT and the next operation state is also the low power consumption operation state. When the verify result Verify becomes "1", the signal SD_EN becomes "0" regardless of a value of the signal STB_OUT and the memory 22 goes into the normal operation state.

(Example of Protocol Control Section 13a, Verify Timing Control Section 60, and Verify Control Section 61)

Figure 13:
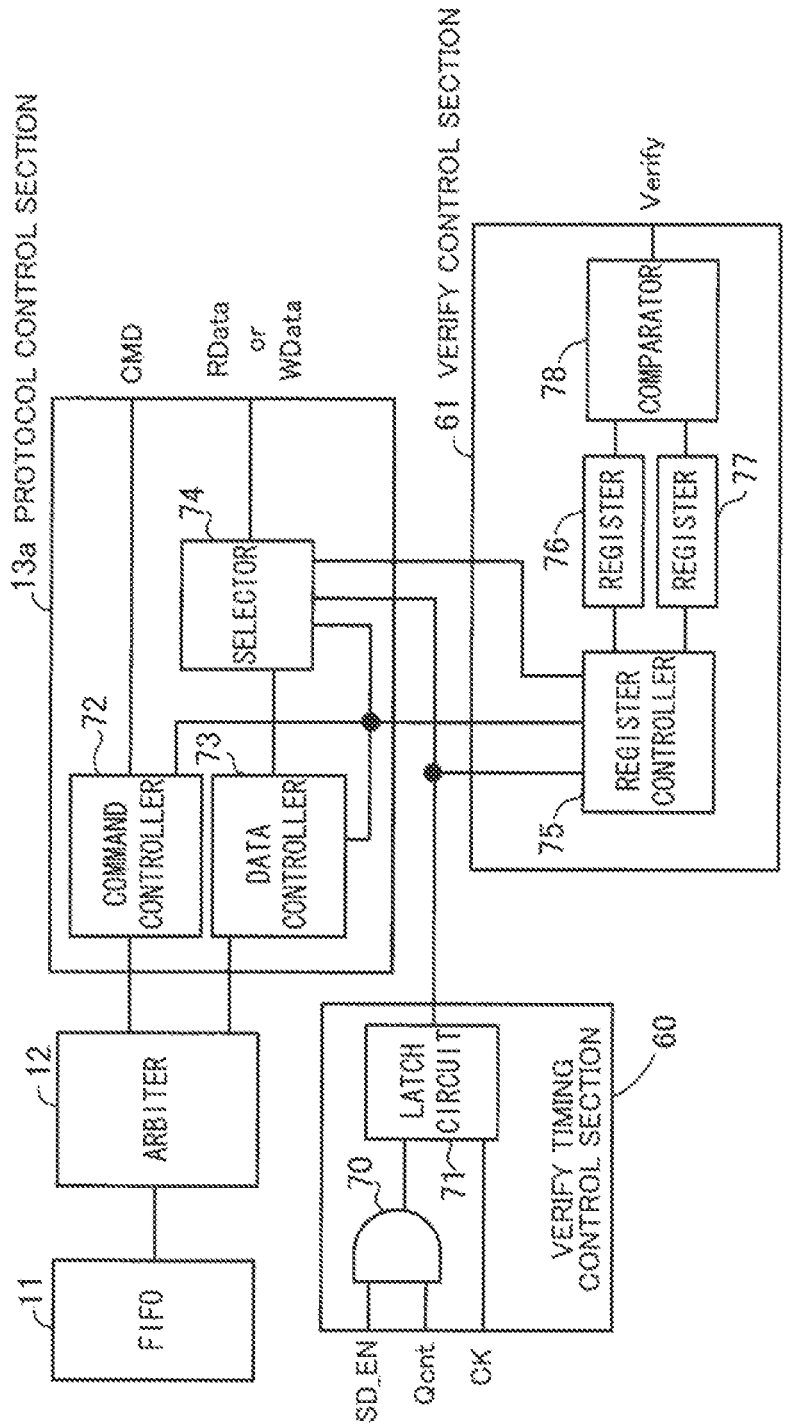
FIG. 13 indicates an example of a protocol control section, a verify timing control section, and a verify control section.

FIG. 13 indicates an example of a protocol control section, the verify timing control section, and the verify control section.

The verify timing control section 60 includes an AND circuit 70 and a latch circuit 71.

A signal SD_EN outputted from the access monitor 16a and a signal Qcnt outputted from a Qcnt generation section 14 are inputted to the AND circuit 70. The AND circuit 70 performs an AND logic operation on them and outputs a result.

The latch circuit 71 accepts a signal outputted from the AND circuit 70 in response to a clock signal CK and outputs a signal (hereinafter represented as the signal Veri_EN) for giving instruction to or not to perform verify. In the following description, instruction to perform verify are given at the time of the signal Veri_EN being "1" and instruction not to perform verify are given at the time of the signal Veri_EN being "0".

When, in a state in which the signal SD_EN is "1", access to the memory 22 occurs and the signal Qcnt becomes "1", the verify timing control section 60 makes the signal Veri_EN "1". When the signal SD_EN or the signal Qcnt is "0", the verify timing control section 60 makes the signal Veri_EN "0".

A protocol control section 13a includes a command controller 72, a data controller 73, and a selector 74.

The command controller 72 receives via an arbiter 12 a command stored in an FIFO 11, and informs the memory 22 of the command in accordance with a protocol. In addition, on the basis of the received command, the command controller 72 outputs a signal (hereinafter represented as the signal R/W) which indicates whether the command designates read operation or write operation. In the following description it is assumed that R/W=0 designates read operation and that R/W=1 designates write operation.

At write time the data controller 73 receives via the arbiter 12 write data WData stored in the FIFO 11, and outputs it in accordance with the protocol. At read time the data controller 73 transmits to the arbiter 12 read data RData transmitted thereto via the selector 74.

The selector 74 receives a signal R/W outputted from the command controller 72. At read time the selector 74 selects read data RData read out from the memory 22 and informs the data controller 73 of it. At write time the selector 74 selects write data WData and outputs it to the memory 22. Furthermore, the selector 74 informs, according to a signal Veri_EN and a signal R/W, the verify control section 61 of read data RData read out from the memory 22 or write data WData supplied from the data controller 73 as verify data.

The verify control section 61 includes a register controller 75, registers 76 and 77, and a comparator 78.

The register controller 75 stores verify data of which the protocol control section 13a informs the register controller 75 in the register 76 or 77 according to a signal Veri_EN and a signal R/W. The comparator 78 compares data stored in the registers 76 and 77. If the data stored in the registers 76 and 77 matches, then the comparator 78 outputs "1" as a verify result Verify. If the data stored in the registers 76 and 77 does not match, then the comparator 78 outputs "0" as a verify result Verify.

(Example of Operation of Protocol Control Section 13a, Verify Timing Control Section 60, and Verify Control Section 61)

A signal SD_EN is "0" at normal operation time. A signal Veri_EN outputted from the verify timing control section 60 is "0". If a signal R/W is "0" at this time, then read operation is performed and read data RData read out from the memory 22 is transmitted to the data controller 73 by the selector 74. The read data RData is then transmitted from the data controller 73 to a masters 20-1 through 20-n side via the arbiter 12 and the FIFO 11. If the signal R/W is "1", then write operation is performed. The selector 74 selects write data WData transmitted thereto from one of the masters 20-1 through 20-n via the FIFO 11, the arbiter 12, and the data controller 73, and outputs it to the memory 22.

The signal SD_EN is "1" at low power consumption operation time. When a signal Qcnt is "1", the signal Veri_EN outputted from the verify timing control section 60 is "1" and verify is performed.

Figure 14:
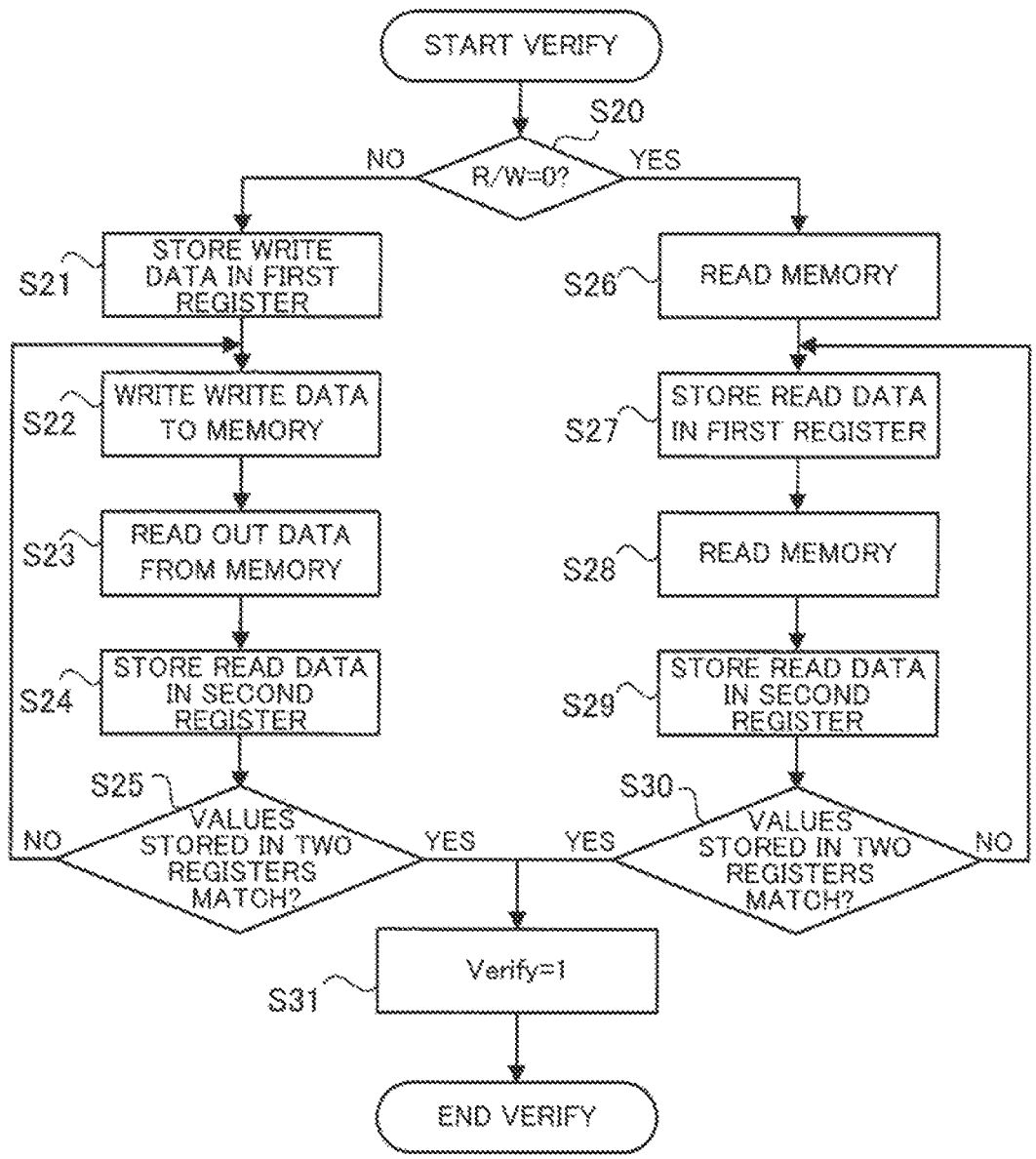
FIG. 14 is a flow chart of an example of verify.

FIG. 14 is a flow chart of an example of verify.

It is assumed that an initial value of a verify result Verify is "0".

When a signal Veri_EN becomes "1" and verify is started, the selector 74 and the register controller 75 determine whether or not a signal R/W is "0" (step S20). The signal R/W is "1" at write operation time, so step S21 is performed. In step S21, the selector 74 supplies to the register controller 75 write data WData to be written to the memory 22 as verify data. The register controller 75 then stores the write data WData in the first register 76 (step S21).

Furthermore, the selector 74 outputs the write data WData to the memory 22. As a result, the write data WData is written to the memory 22 (step S22). After that, the written data is read out (step S23).

The selector 74 transmits read data RData to the register controller 75. The register controller 75 stores the read data RData in the second register 77 (step S24). The comparator 78 determines whether or not the values stored in the registers 76 and 77 match (step S25). If the values stored in the registers 76 and 77 match, then the comparator 78 sets the verify result Verify to "1" (step S31) and ends verify. If the values stored in the registers 76 and 77 do not match, then a process is repeated from step S22.

On the other hand, the signal R/W is "0" at read operation time, so step S26 is performed. In step S26, an area in the memory 22 is designated and read operation is performed. The selector 74 transmits read data RData to the register controller 75. The register controller 75 stores the read data RData in the first register 76 (step S27).

Next, the area in the memory 22 designated in step S26 is read (step S28). The selector 74 transmits read data RData to the register controller 75. The register controller 75 stores the read data RData in the second register 77 (step S29). The comparator 78 determines whether or not the values stored in the registers 76 and 77 match (step S30). If the values stored in the registers 76 and 77 match, then the comparator 78 performs the above step S31. That is to say, the comparator 78 sets the verify result Verify to "1" and ends verify. If the values stored in the registers 76 and 77 do not match, then a process is repeated from step S27.

Figure 15:
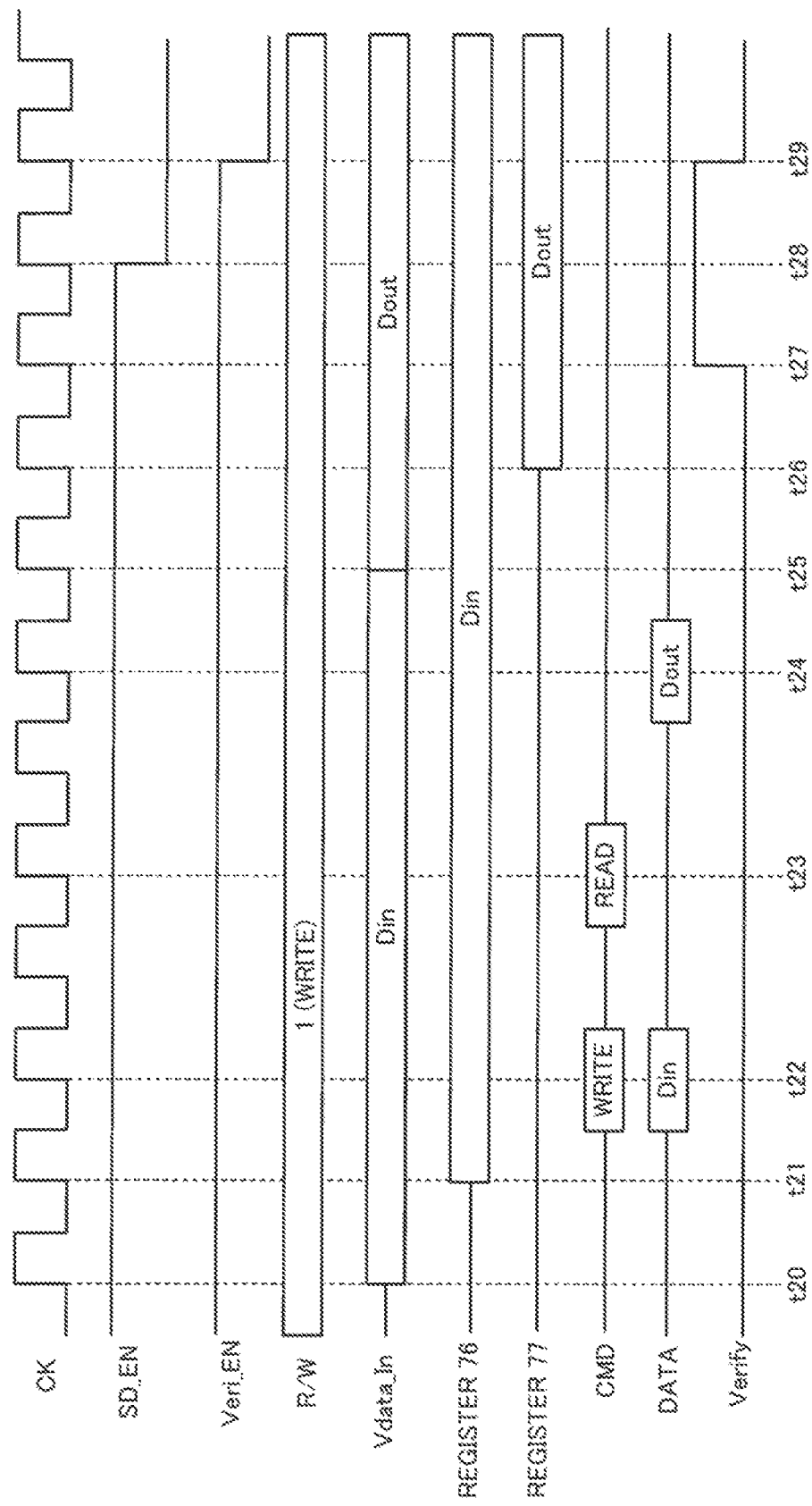
FIG. 15 is a timing chart of an example of write verify.

FIG. 15 is a timing chart of an example of write verify. Examples of a clock signal CK, a signal SD_EN, a signal Veri_EN, a signal P/W, verify data Vdata_In, values stored in the registers 76 and 77, the contents of a command CMD, data inputted to or outputted from the memory 22, and a verify result Verify at write verify time are indicated.

The signal SD_EN, the signal Veri_EN, and the signal R/W are "1" at write verify time. When the register controller 75 receives from the selector 74 data Din transmitted from the masters 20-1 through 20-n side as the verify data Vdata_In (at timing t20), the register controller 75 stores the data Din in the register 76 (at timing t21). When a command CMD by which write is designated is issued, the data Din is written to a determined area in the memory 22 (at timing t22).

When a command CMD by which read is designated is issued (at timing t23), data Dout written at the timing t22 to the determined area is read out from the memory 22 (at timing t24). The data Dout read out is supplied to the register controller 75 as the verify data Vdata_In (at timing t25). The register controller 75 stores the data Dout in the register 77 (at timing t26).

The comparator 78 compares the values stored in the registers 76 and 77. In the example of FIG. 15, the determination that the data Din and the data Dout match is made and the verify result Verify is "1" (at timing t27). As a result, the signal SD_EN outputted from the access monitor 16a becomes "0" (at timing t28), the signal Veri_EN becomes "0", and the verify result Verify also becomes "0" under the control of, for example, the register controller 75 (at timing t29).

Figure 16:
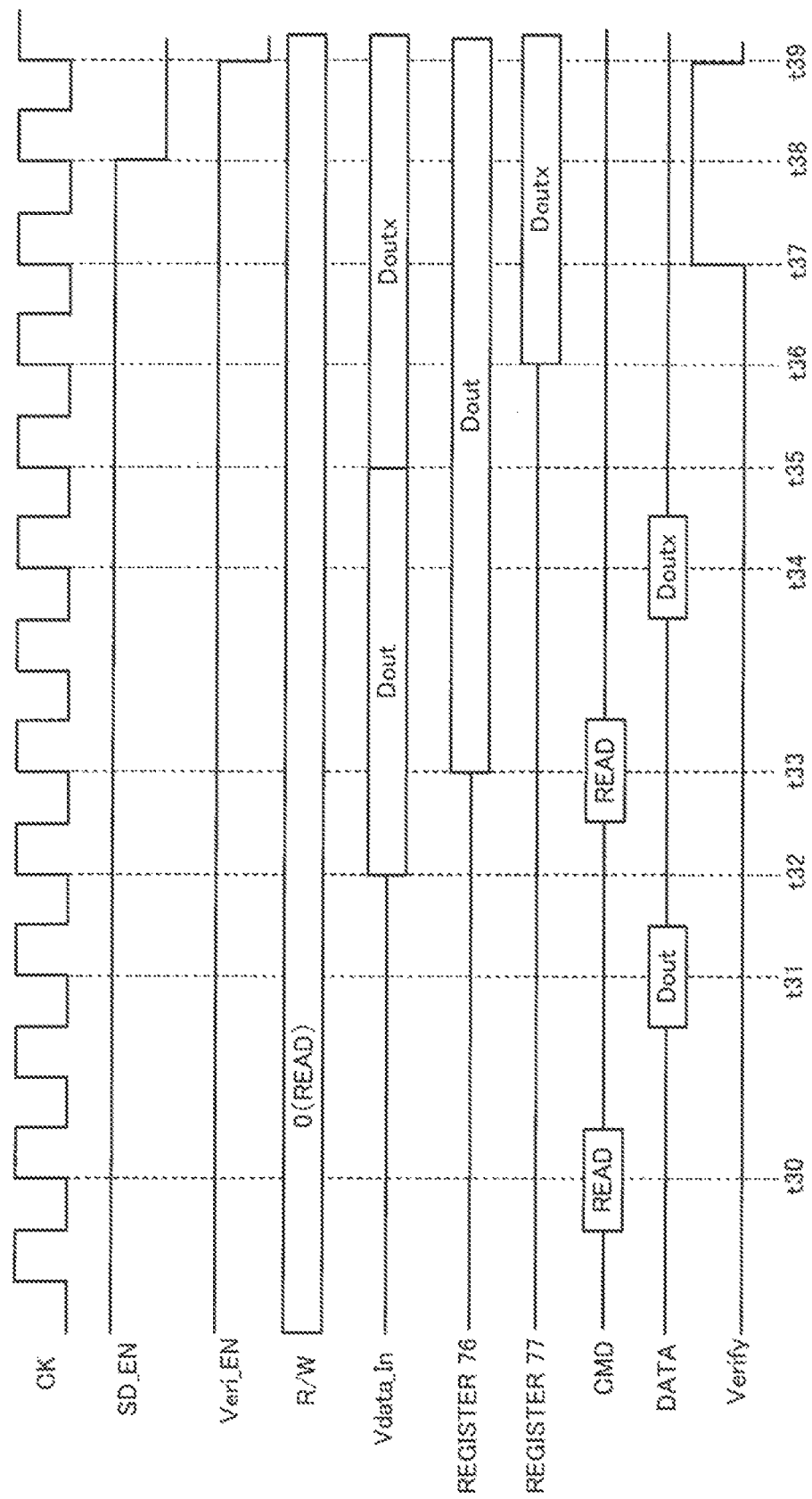
FIG. 16 is a timing chart of an example of read verify.

FIG. 16 is a timing chart of an example of read verify. Examples of a clock signal CK, a signal SD_EN, a signal Veri_EN, a signal R/W, verify data Vdata_In, values stored in the registers 76 and 77, the contents of a command CMD, data inputted to or outputted from the memory 22, and a verify result Verify at read verify time are indicated.

At read verify time, the signal SD_EN and the signal Veri_EN are "1" and the signal R/W is "0". When a command CMD by which read is designated is issued (at timing t30), data Dout is read out from a determined area in the memory 22 (at timing t31). The data Dout read out is supplied to the register controller 75 as the verify data Vdata_In (at timing t32). The register controller 75 stores the data Dout in the register 76 (at timing t33).

Furthermore, a command CMD by which read is designated is issued again at the timing t33. As a result, data Doutx is read out from the above area in the memory 22' (at timing t34). The data Doutx read out is supplied to the register controller 75 as the verify data Vdata_In (at timing t35). The register controller 75 stores the data Doutx in the register 77 (at timing t36).

The comparator 78 compares the values stored in the registers 76 and 77. In the example of FIG. 16, the determination that the data Dout and the data Doutx match is made and the verify result Verify is "1" (at timing t37). As a result, the signal SD_EN outputted from the access monitor 16a becomes "0" (at timing t38), the signal Veri_EN becomes "0", and the verify result Verify also becomes "0" under the control of, for example, the register controller 75 (at timing t39).

(Example of Operation of Whole of Semiconductor Device 10a According to Third Embodiment)

Figure 17:
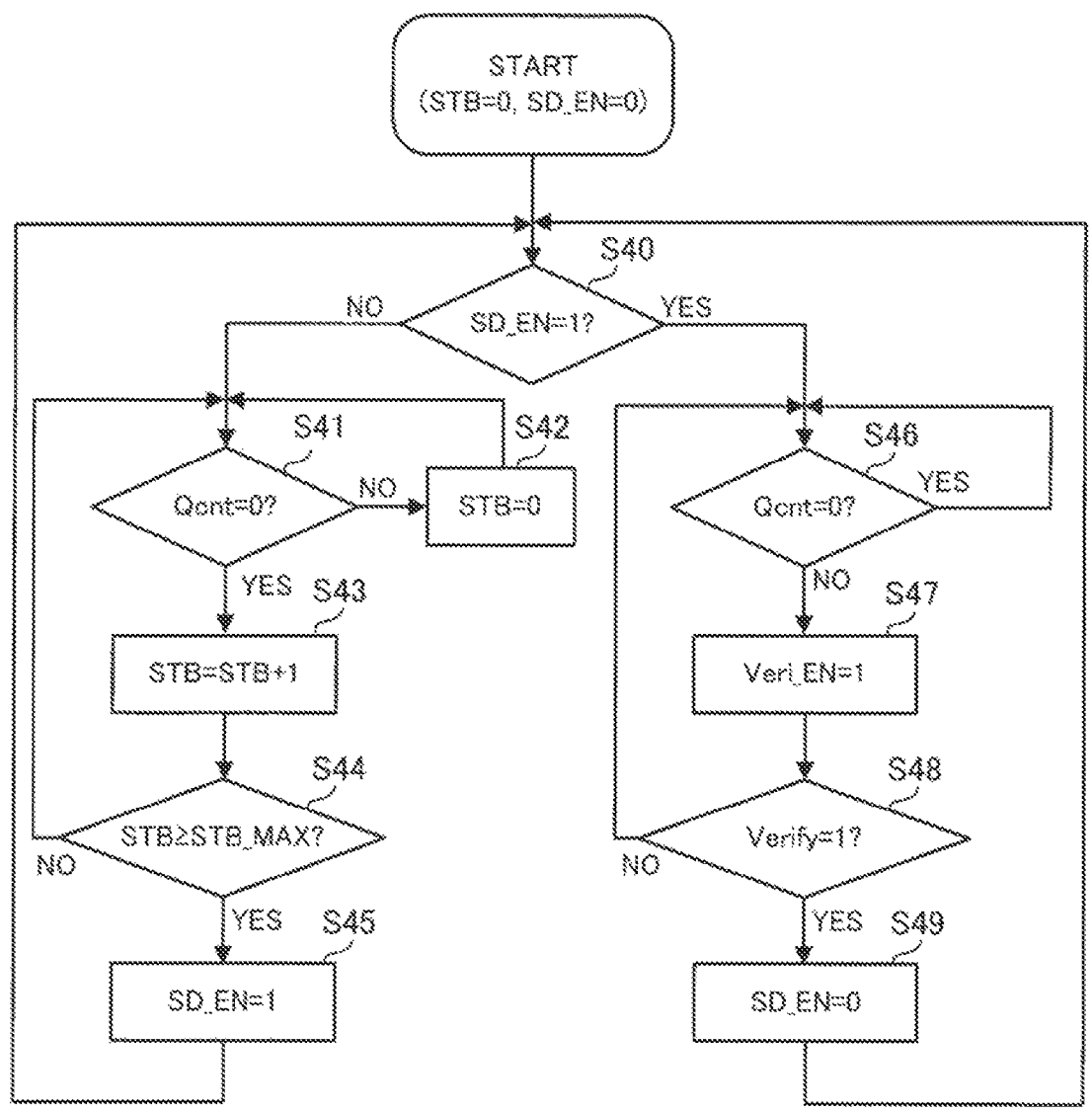
FIG. 17 is a flow chart of an example of the operation of the semiconductor device according to the third embodiment.

FIG. 17 is a flow chart of an example of the operation of the semiconductor device according to the third embodiment.

It is assumed that a count value STB and a signal SD_EN are "0" at first.

Steps S40, S41, S42, S43, S44, and S45 are the same as steps S1 through S6, respectively, indicated in FIG. 8, so description of them will be omitted.

If the signal SD_EN is "1" at the time of performing step S40, then the access monitor 16a determines in step S46 whether or not a signal Qcnt is "0". When access to the memory 22 does not occur and the FIFO 11 is in an empty state, the signal Qcnt is "0" and step S46 is repeated.

When a command is supplied to the FIFO 11 and access to the memory 22 occurs, the signal Qcnt becomes "1" and a signal Veri_EN outputted from the verify timing control section 60 becomes "1" (step S47). As a result, the above verify is performed.

The access monitor 16a then determines whether or not a verify result Verify transmitted thereto from the verify control section 61 is "1" (step S48). If the verify result Verify is "0", then a process is repeated from step S46. If the verify result Verify is "1", then the access monitor 16a makes the signal SD_EN "0" (step S49). As a result, the verify by the verify control section 61 ends and the memory 22 goes into a normal operation state. After that, a process is repeated from step S40 until, for example, the supply of power is stopped.

Figure 18:
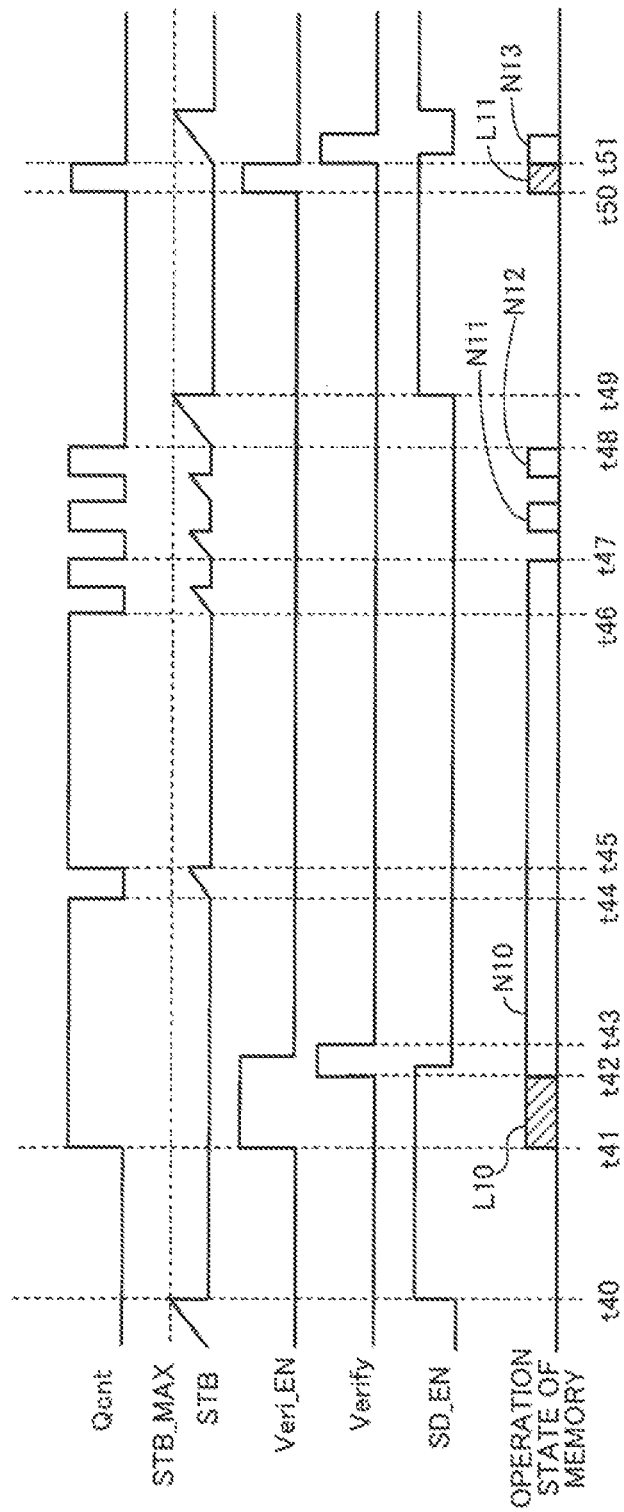
FIG. 18 is a timing chart of an example of the operation of the semiconductor device according to the third embodiment.

FIG. 18 is a timing chart of an example of the operation of the semiconductor device according to the third embodiment.

FIG. 18 indicates examples of a signal Qcnt, a count value STB of an STB counter 31, a signal Veri_EN, a verify result Verify, a signal SD_EN, and an operation state of the memory 22. A clock signal CK is not indicated.

When the signal Qcnt is "0" in a state in which the signal SD_EN is "0", the STB counter 31 performs count-up operation in synchronization with the clock signal CK. When the count value STB reaches the upper limit value STB_MAX, the signal SD_EN becomes "1" (at timing t40). When the signal Qcnt becomes "1" in a state in which the signal SD_EN is "1", the signal Veri_EN becomes "1", access to the memory 22 is restricted, and the memory 22 goes into a state L10 in which verify is performed (at timing t421).

When the verify result Verify becomes "1" (at timing t42), the memory 22 goes into a state N10 in which normal, operation is performed. Furthermore, at this time the signal SD_EN becomes "0". As a result, the signal Veri_EN also becomes "0". In addition, the verify result Verify also becomes "0" (at timing t43).

As indicated in FIG. 18, the signal. Qcnt becomes "0" at timing t44. However, the signal Qcnt returns to "1" at timing t45 at which the count value STB does not reach the upper limit value STB_MAX, so the signal. SD_EN remains at "0". While the memory 22 is in the state L10, there is a delay caused by a stoppage of execution of a command stored in the FIFO 11. In order to compensate for this delay, the state N10 in which normal operation is performed continues.

The signal Qcnt frequently becomes "0" and "1" from timing t46 to timing t48. At this time the count value STB does not reach the upper limit value STB_MAX, so the signal SD_EN remains at "0". As stated above, while the memory 22 is in the state L10, there is a delay caused by a stoppage of execution of a command stored in the FIFO 11. In order to compensate for this delay, the memory 22 continues to be in the state N10 in which normal operation is performed until the timing t47. After that, while the signal Qcnt is "1", the memory 22 is in states N11 and N12 in which normal operation is performed.

When the count value STB reaches the upper limit value STB_MAX in a state in which the signal Qcnt is "0", the signal SD_EN becomes "1" (at timing t49). As a result, the memory 22 goes again into a state L11 in which verify is performed at timing t50 at which the signal Qcnt becomes "1". After that, in the example of FIG. 18, the verify result Verify "1" is obtained at timing t51.

In the example of FIG. 18, the signal Qcnt becomes "0" when the verify result Verify becomes "1". While the memory 22 is in the state L11, there is a delay caused by a stoppage of execution of a command stored in the FIFO 11. In order to compensate for this delay, the memory 22 goes in a state N13 in which normal operation is performed.

As has been described, the access monitor 16a restricts the switching of the memory 22 from a normal operation state to a low power consumption operation state until a no-access period lasts for a determined period. This prevents frequent switching between the normal operation state and the low power consumption operation state based on the presence or absence of access. As a result, the occurrence of a malfunction in the memory 22 caused by power supply noise or the like can be prevented.

Furthermore, the access monitor 16a restricts the switching of the memory 22 from the low power consumption operation state to the normal operation state regardless of the presence or absence of access until the access monitor 16a receives a verify result (Verify=1) which indicates that write or read is performed correctly. This prevents frequent switching between the normal operation state and the low power consumption operation state based on the presence or absence of access. As a result, the occurrence of a malfunction in the memory 22 caused by power supply noise or the like can be prevented.

In addition, when the memory 22 makes a transition from the low power consumption operation state, such as a standby state, to the normal operation state, the semiconductor device 10a according to the third embodiment performs verify which consumes less power than normal operation. This controls a change in voltage caused by a change in load which occurs at the time of a transition from the standby state to the normal operation state. Accordingly, the occurrence of a malfunction in the memory 22 can be prevented.

(Fourth Embodiment)

Figure 19:
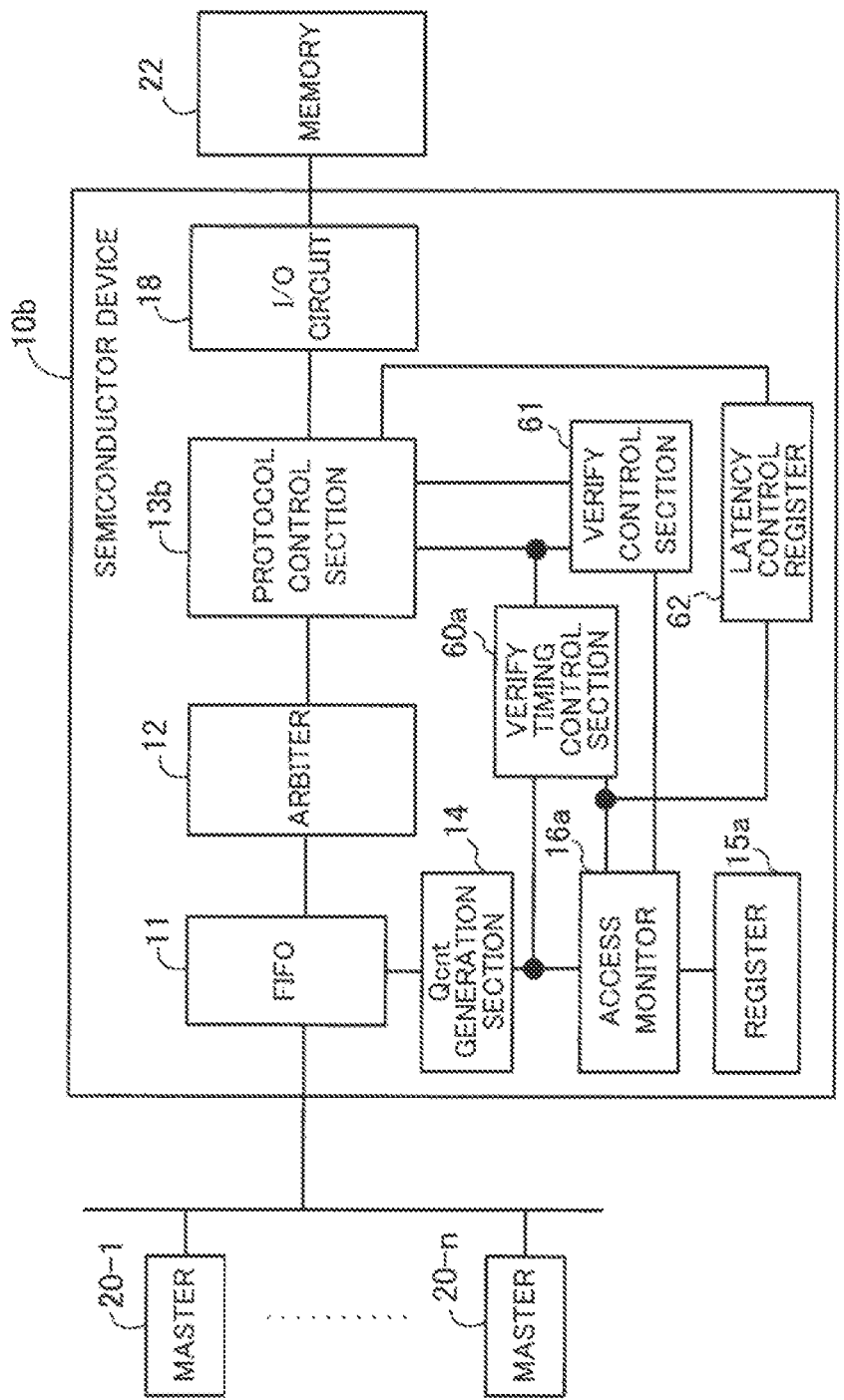
FIG. 19 indicates an example of a semiconductor device according to a fourth embodiment.

FIG. 19 indicates an example of a semiconductor device according to a fourth embodiment. Components in FIG. 19 which are the same as those included in the semiconductor device 10a according to the third embodiment illustrated in FIG. 10 are marked with the same numerals and description of them will be omitted.

A semiconductor device 10b includes a latency control register 62 which outputs at low power consumption operation time latency for tRCD (Row-to-Column Delay), tRAS (Row Address Strobe), tRC (Row Cycle), and the like that is longer than latency at normal operation time.

(Example of Latency Control Register 62)

Figure 20:
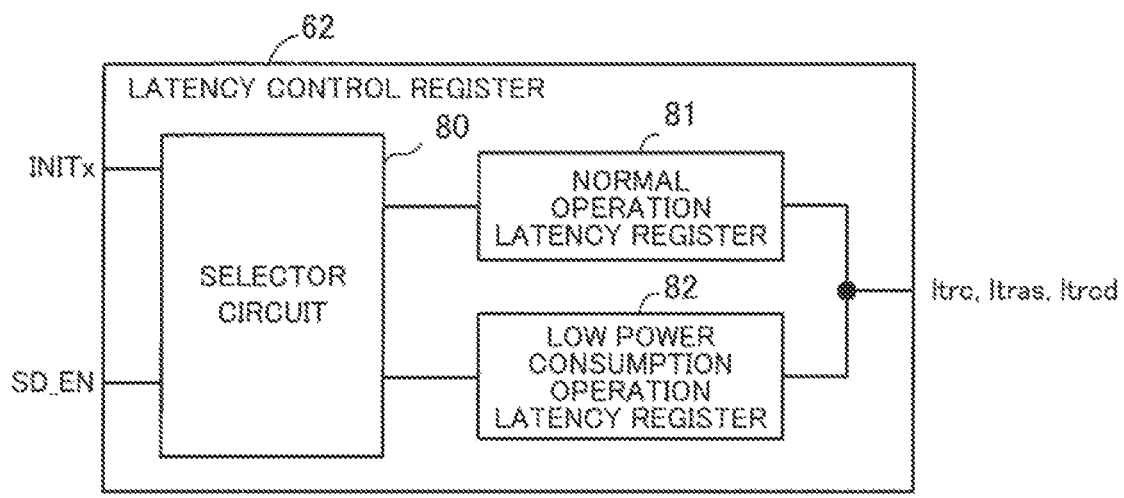
FIG. 20 indicates an example of a latency control register.

FIG. 20 indicates an example of the latency control register.

The latency control register 62 includes a selector circuit 80, a normal operation latency register 81, and a low power consumption operation latency register 82.

The selector circuit 80 selects the normal operation latency register 81 or the low power consumption operation latency register 82 which is to be made valid according to a signal INITx or SD_EN. The signal INITx is a signal for initializing latency (for forcedly designating a value of the normal operation latency register 81). For example, an initialization signal outputted from a power-on reset circuit (not illustrated) or the like is used as the signal INITx.

The normal operation latency register 81 stores latency for tRCD, tRAS, tRC, and the like used at normal operation time.

The low power consumption operation latency register 82 stores latency for tRCD, tRAS, tRC, and the like used at low power consumption operation time.

When the signal SD_EN is "0" or when the signal INITx is "1.", the normal operation latency register 81 is valid and the low power consumption operation latency register 82 is invalid.

When the signal SD_EN is "1" and the signal INITx is "0", the normal operation latency register 81 is invalid and the low power consumption operation latency register 82 is valid.

A command controller 72 included in a protocol control section 13b is informed of values stored in the normal operation latency register 81 or the low power consumption operation latency register 82 which becomes valid as latency ltrc, ltras, and ltrcd. As a result, the command controller 72 exercises command control according to the received latency ltrc, ltras, and ltrcd.

The latency ltrc is latency for tRC. The latency liras is latency for tRAS. The latency ltrcd is latency for tRCD.

(Example of Operation of Latency Control Register 62)

Figure 21:
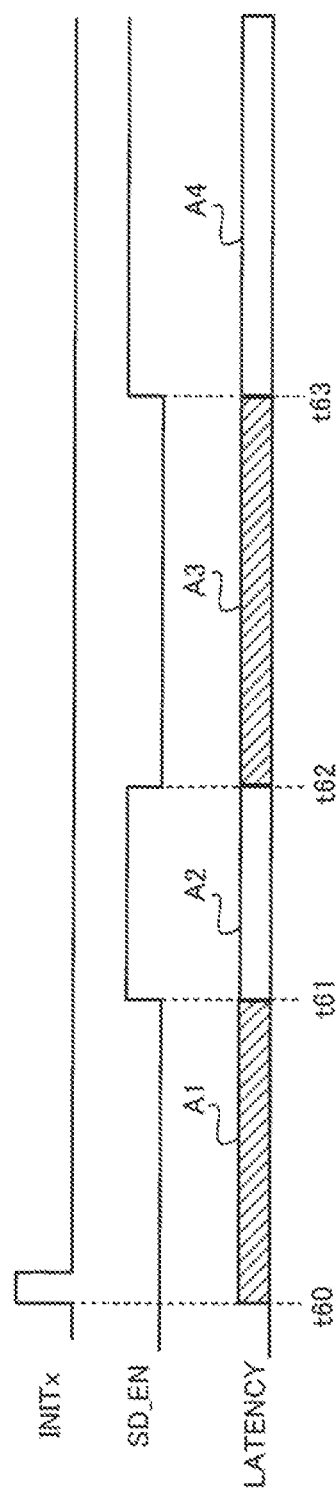
FIG. 21 indicates an example of the operation of the latency control register.

FIG. 21 indicates an example of the operation of the latency control register. FIG. 21 indicates an example of a signal INITx, a signal SD_EN, and latency.

When the signal INITx becomes "1" (at timing t60), the selector circuit 80 makes the normal operation latency register 81 valid. As a result, latency A1 (above latency ltrc, ltras, and ltrcd) outputted from the latency control register 62 is used at normal operation time.

When the signal. INITx becomes "0" and the signal SD_EN changes from "0" to "1" (at timing t61), the selector circuit 80 makes the normal operation latency register 81 invalid and makes the low power consumption operation latency register 82 valid. As a result, latency A2 outputted from the latency control register 62 is used at low power consumption operation time.

When the signal SD_EN changes from "1" to "0" (at timing t62), the selector circuit 80 makes the low power consumption operation latency register 82 invalid and makes the normal operation latency register 81 valid. As a result, latency A3 outputted from the latency control register 62 is used at normal operation time.

When the signal SD_EN changes again from "0" to "1" (at timing t63), the selector circuit 80 makes the normal operation latency register 81 invalid and makes the low power consumption operation latency register 82 valid. As a result, latency A4 outputted from the latency control register 62 is used at low power consumption operation time.

Figure 22:
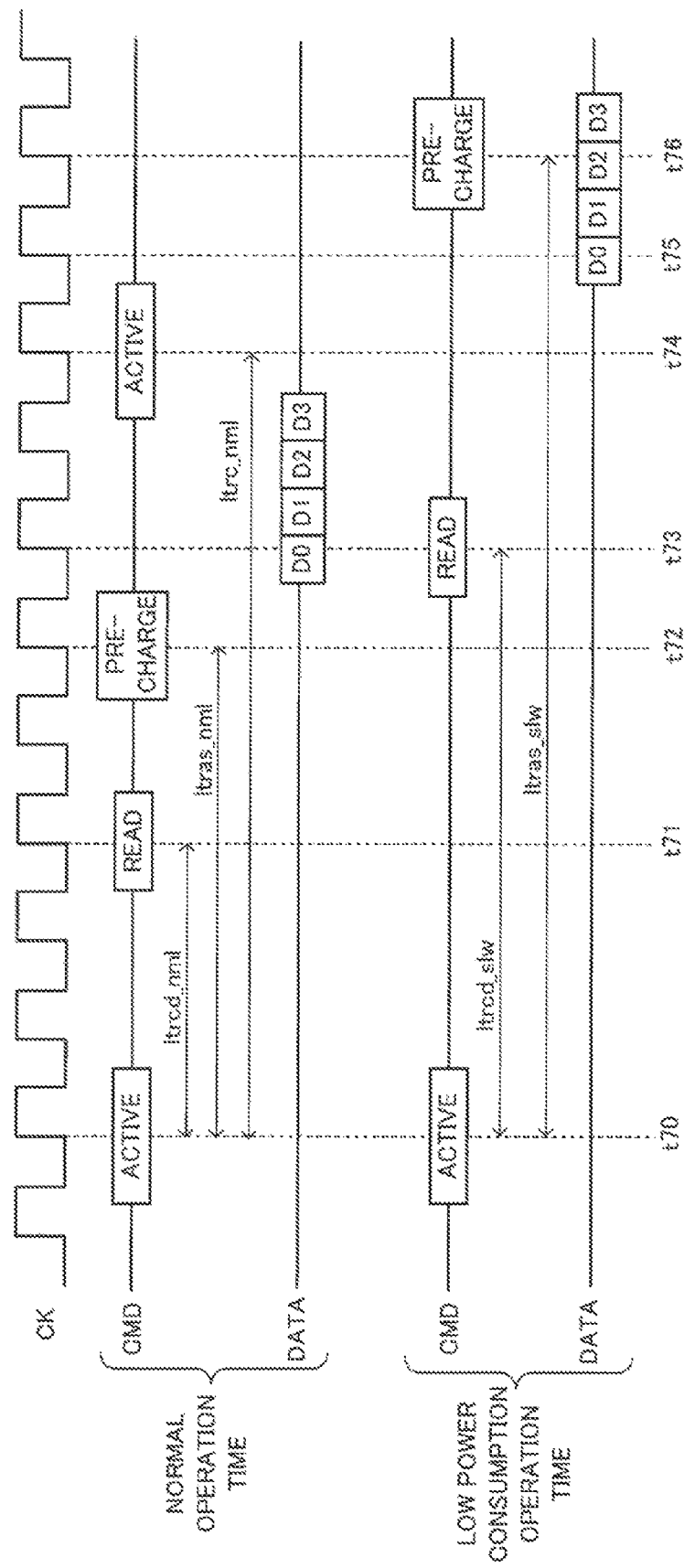
FIG. 22 indicates an example of latency at normal operation time and low power consumption operation time.

FIG. 22 indicates an example of latency at normal operation time and low power consumption operation time. FIG. 22 indicates examples of a clock signal CK, commands, data, and latency at normal operation time and low power consumption operation time.

Latency ltrcd_nml is latency for tRCD at the normal operation time. The latency ltrcd_nml is time from timing t70 at which the command controller 72 supplies to a memory 22 an active command for designating an address of a bank to be accessed to timing t71 at which the command controller 72 supplies a read command to the memory 22.

Latency ltras_nml is latency for tRAS at the normal operation time. The latency ltras_nml is time from the timing t70 at which the command controller 72 supplies the active command to the memory 22 to timing t72 at which the command controller 72 supplies a precharge command to the memory 22. Furthermore, in the example of FIG. 22, data D0, D1, D2, and D3 are read out from the memory 22 at timing t73 at the normal operation time.

On the other hand, ltrcd_slw is latency for tRCD at the low power consumption operation time. The latency ltrcd_slw is time from the timing t70 at which the command controller 72 supplies an active command to the memory 22 to timing t73 at which the command controller 72 supplies a read command to the memory 22. In the example of FIG. 22, the length of the latency ltrcd_slw is twice that of the latency ltrcd_nml at the normal operation time.

Latency ltras_slw is latency for tRAS at the low power consumption operation time. The latency ltras_slw is time from the timing t70 at which the command controller 72 supplies the active command to the memory 22 to timing t76 at which the command controller 72 supplies a precharge command to the memory 22. In the example of FIG. 22, the length of the latency ltras_slw is twice that of the latency ltras_nml at the normal operation time. In the example of FIG. 22, the data D0, D1, D2, and D3 are read out from the memory 22 at timing t75 at the low power consumption operation time.

Latency ltrc_nml is latency for tRC at the normal operation time. The latency ltrc_nml is time from the timing t70 at which the command controller 72 supplies the active command to timing t74 at which the command controller 72 supplies a next active command to the memory 22.

In FIG. 22, latency for tRC at the low power consumption operation time is not indicated.

As stated above, latency at the low power consumption operation time is made longer than latency at the normal operation time. By doing so, the power consumption of the memory 22 is reduced. In addition, the latency control register 62 can easily perform switching between normal operation and low power consumption operation only by selecting latency held in advance in the normal operation latency register 81 or the low power consumption operation latency register 82.

(Example of Verify Timing Control Section 60a)

Figure 23:
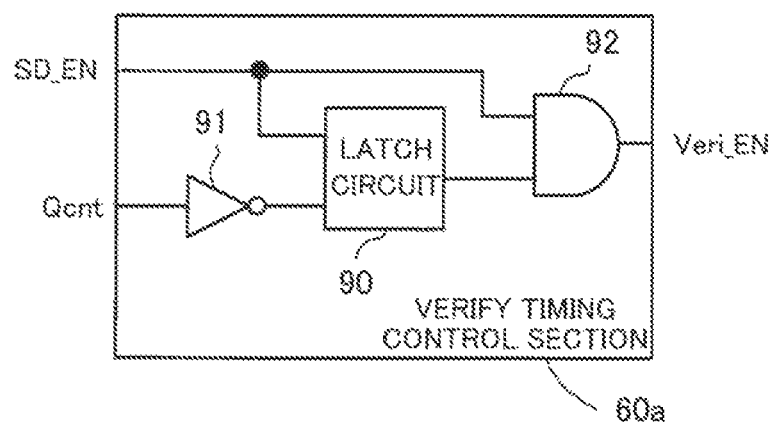
FIG. 23 indicates an example of a verify timing control section.

FIG. 23 indicates an example of a verify timing control section.

A verify timing control section 60a included in the semiconductor device 20b according to the fourth embodiment includes a latch circuit 90, an inverter 91, and an AND circuit 92.

The latch circuit 90 receives a signal. Qcnt via the inverter 91. When the signal Qcnt is "0", the latch circuit 90 accepts a value of a signal SD_EN. The signal SD_EN is inputted to one input terminal of the AND circuit 92 and a signal outputted from the latch circuit 90 is inputted to the other input terminal of the AND circuit 92. A signal Veri_EN which makes the above verify valid or invalid is outputted from the AND circuit 92.

When the memory 22 is in a low power consumption operation state (SD_EN=1) and access to the memory 22 is interrupted (Qcnt=0), the verify timing control section 60a having the above structure makes the signal Veri_EN "1" and verify is performed.

The protocol control section 13b includes the same components that are illustrated in FIG. 13, so the protocol control section 13b is not illustrated. The protocol control section 13b exercises command control according to latency outputted from the latency control register 62.

(Example of Operation of Whole of Semiconductor Device 10b According to Fourth Embodiment)

Figure 24:
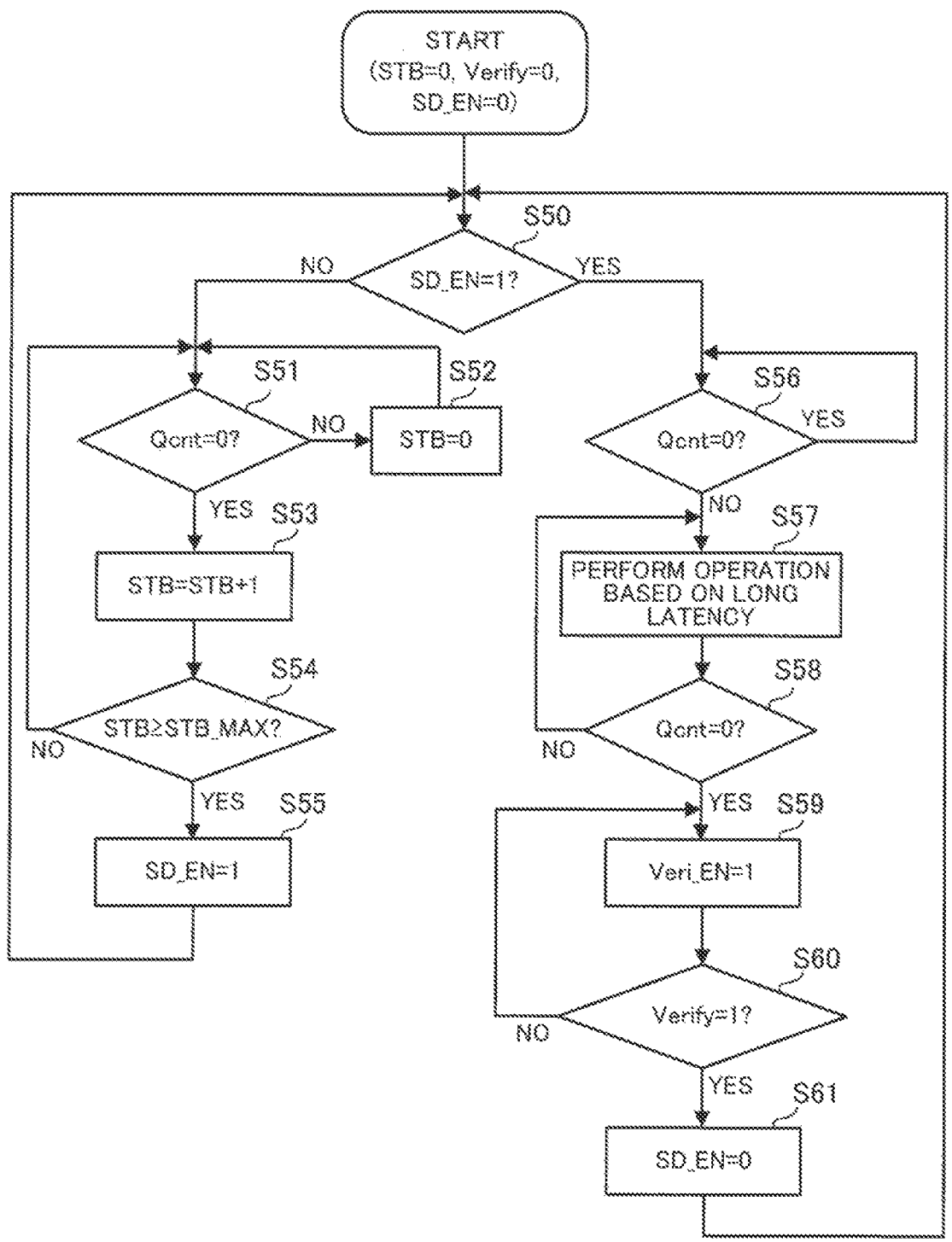
FIG. 24 is a flow chart of an example of the operation of the semiconductor device according to the fourth embodiment.

FIG. 24 is a flow chart of an example of the operation of the semiconductor device according to the fourth embodiment.

It is assumed that a count value STB, a signal SD_EN, and a verify result Verify are "0" at first. Furthermore, it is assumed that a signal INITx is "0".

Steps S50, S51, S52, S53, S54, and S55 are almost the same as steps S1 through S6, respectively, indicated in FIG. 8. However, when the signal SD_EN is "0", the latency control register 62 makes the normal operation latency register 81 valid and, as stated above, outputs normal operation latency ltrc, ltras, and ltrcd. Accordingly, when a signal Qcnt is "1", normal operation based on the normal operation latency ltrc, ltras, and ltrcd is performed.

If the signal SD_EN is "1" at the time of performing step S50, then an access monitor 16a determines in step S56 whether or not the signal Qcnt is "0". When access to the memory 22 does not occur and a FIFO 11 is in an empty state, the signal Qcnt is "0" and step S56 is repeated. Furthermore, if the signal SD_EN is "1", then the latency control register 62 makes the low power consumption operation latency register 82 valid and, as stated above, outputs latency ltrc, ltras, and ltrcd which are longer than the latency ltrc, ltras, and ltrcd, respectively, at normal operation time.

When a command is supplied to the FIFO 11 and access to the memory 22 occurs, the signal Qcnt becomes "1" and operation based on the latency ltrc, ltras, and ltrcd which are longer than the latency ltrc, ltras, and ltrcd, respectively, at normal operation time is performed (step S57). The access monitor 16a determines whether or not the signal Qcnt is "0"

(step S58). If the signal Qcnt is "0", then step S59 is performed. If the signal Qcnt is "1", then a process is repeated from step S57.

In step S59, the verify timing control section 60a makes a signal Veri_EN "1" (step S59). As a result, the above verify is performed.

The access monitor 16a then determines whether or not the verify result Verify transmitted thereto from the verify control section 61 is "1" (step S60). If the verify result Verify is "0", then a process is repeated from step S59. If the verify result Verify is "1", then the access monitor 16a makes the signal SD_EN "0" (step S61). As a result, the verify by the verify control section 61 ends. The latency control register 62 makes the normal operation latency register 81 valid and, as stated above, outputs the normal operation latency ltrc, ltras, and ltrcd. By doing so, the memory 22 goes into a normal operation state. After that, a process is repeated from step S50 until, for example, the supply of power is stopped.

Figure 25:
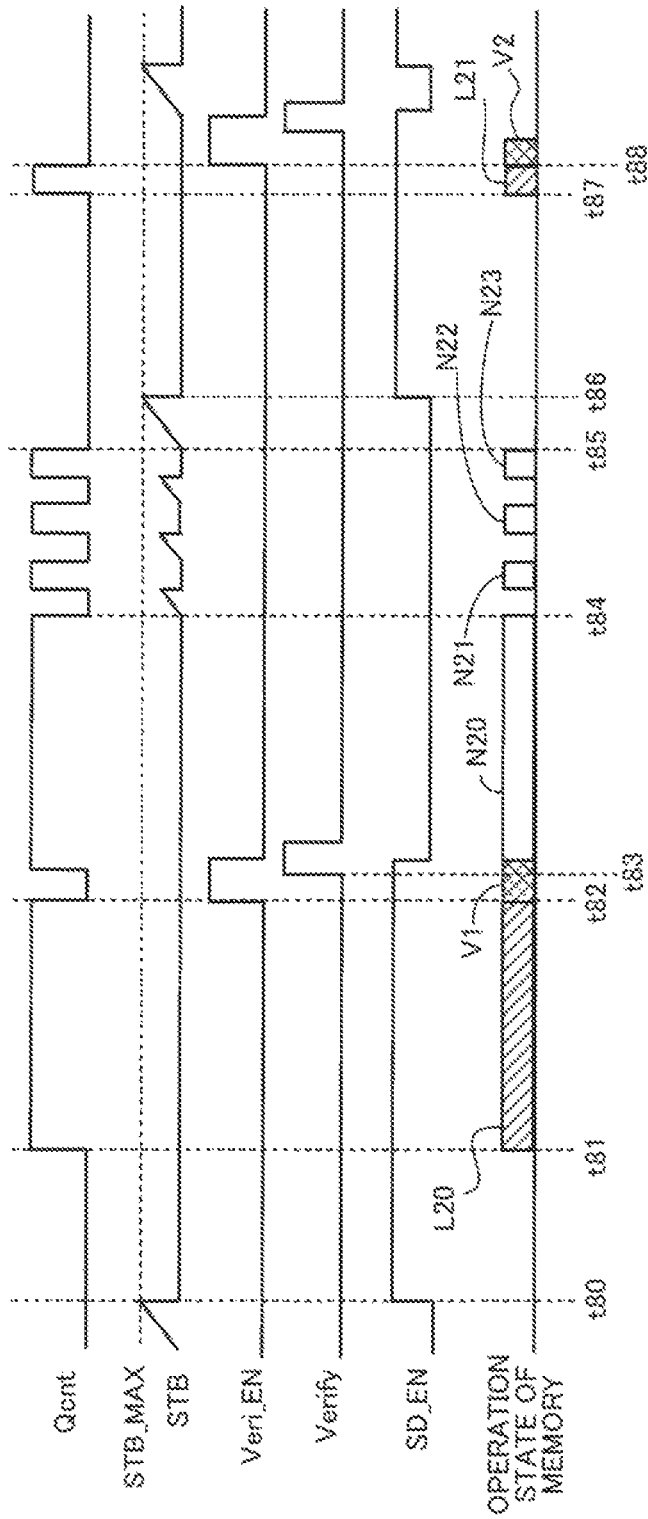
FIG. 25 is a timing chart of an example of the operation of the semiconductor device according to the fourth embodiment.

FIG. 25 is a timing chart of an example of the operation of the semiconductor device according to the fourth embodiment. FIG. 25 indicates examples of a signal Qcnt, a count value STB of an STB counter 31, a signal Veri_EN, a verify result Verify, a signal SD_EN, and an operation state of the memory 22. A clock signal CK is not indicated.

When the signal Qcnt is "0" in a state in which the signal SD_EN is "0", the STB counter 31 performs count-up operation in synchronization with the clock signal CK. When the count value STB reaches an upper limit value STB_MAX, the signal SD_EN becomes "1" (at timing t80). When the signal. Qcnt becomes "1" in a state in which the signal SD_EN is "1", the memory 22 goes into a state L20 in which operation based on latency ltrc, ltras, and ltrcd which are longer than latency ltrc, ltras, and ltrcd, respectively, at normal operation time is performed (at timing t81).

When the signal Qcnt becomes "0" in a state in which the signal SD_EN is "1" (at timing t82), the signal Veri_EN becomes "1" and the memory 22 goes into a state V1 in which verify is performed.

When the verify result Verify becomes "1" (at timing t83), the signal SD_EN becomes "0" and the memory 22 goes into a state N20 in which normal operation based on the normal operation latency ltrc, ltras, and ltrcd is performed.

The signal. Qcnt frequently becomes "0" and "1" from timing t84 to timing t85. However, the count value STB does not reach the upper limit value STB_MAX, so the signal SD_EN remains at "0". Accordingly, while the signal Qcnt is "1", the memory 22 is in states N21, N22, and N23 in which normal operation based on the normal operation latency ltrc, ltras, and ltrcd is performed.

When the count value STB reaches the upper limit value STB_MAX in a state in which the signal Qcnt is "0", the signal SD_EN becomes "1" (at timing t86). As a result, at timing t87 at which the signal. Qcnt becomes "1", the memory 22 goes into a state L21 in which operation based on the latency ltrc, ltras, and ltrcd which are longer than the latency ltrc, ltras, and ltrcd, respectively, at normal operation time is performed.

When the signal Qcnt becomes "0" again, the signal Veri_EN becomes "1" and the memory 22 goes into a state V2 in which verify is performed.

As has been described, the access monitor 16a restricts the switching of the memory 22 from a normal operation state to a low power consumption operation state until a no-access period lasts for a determined period. This prevents frequent switching between the normal operation state and the low power consumption operation state based on the presence or absence of access. As a result, the occurrence of a malfunction in the memory 22 caused by power supply noise or the like can be prevented.

Furthermore, the access monitor 16a restricts the switching of the memory 22 from the low power consumption operation state to the normal operation state regardless of the presence or absence of access until the access monitor 16a receives a verify result (Verify=1) which indicates that write or read is performed correctly. This prevents frequent switching between the normal operation state and the low power consumption operation state based on the presence or absence of access. As a result, the occurrence of a malfunction in the memory 22 caused by power supply noise or the like can be prevented.

In addition, when the signal SD_EN is "1", the operation of the memory 22 is continued with latency made longer than latency at normal operation time. Accordingly, when access to the memory 22 occurs, priority can be given not to verify but to the access.

Moreover, when the memory 22 makes a transition from the low power consumption operation state, such as a standby state, to the normal operation state, the semiconductor device 10b performs operation which consumes less power than normal operation. That is to say, the semiconductor device 10b makes the memory 22 operate with latency made longer than latency at normal operation time, or performs verify. This controls a change in voltage caused by a change in load which occurs at the time of a transition from the standby state to the normal operation state. Accordingly, the occurrence of a malfunction in the memory 22 can be prevented.

In order to realize low power consumption operation, a cycle of a clock signal or driver capability may be changed as with the semiconductor device 10 according to the second embodiment instead of changing latency.

(Fifth Embodiment)

Figure 26:
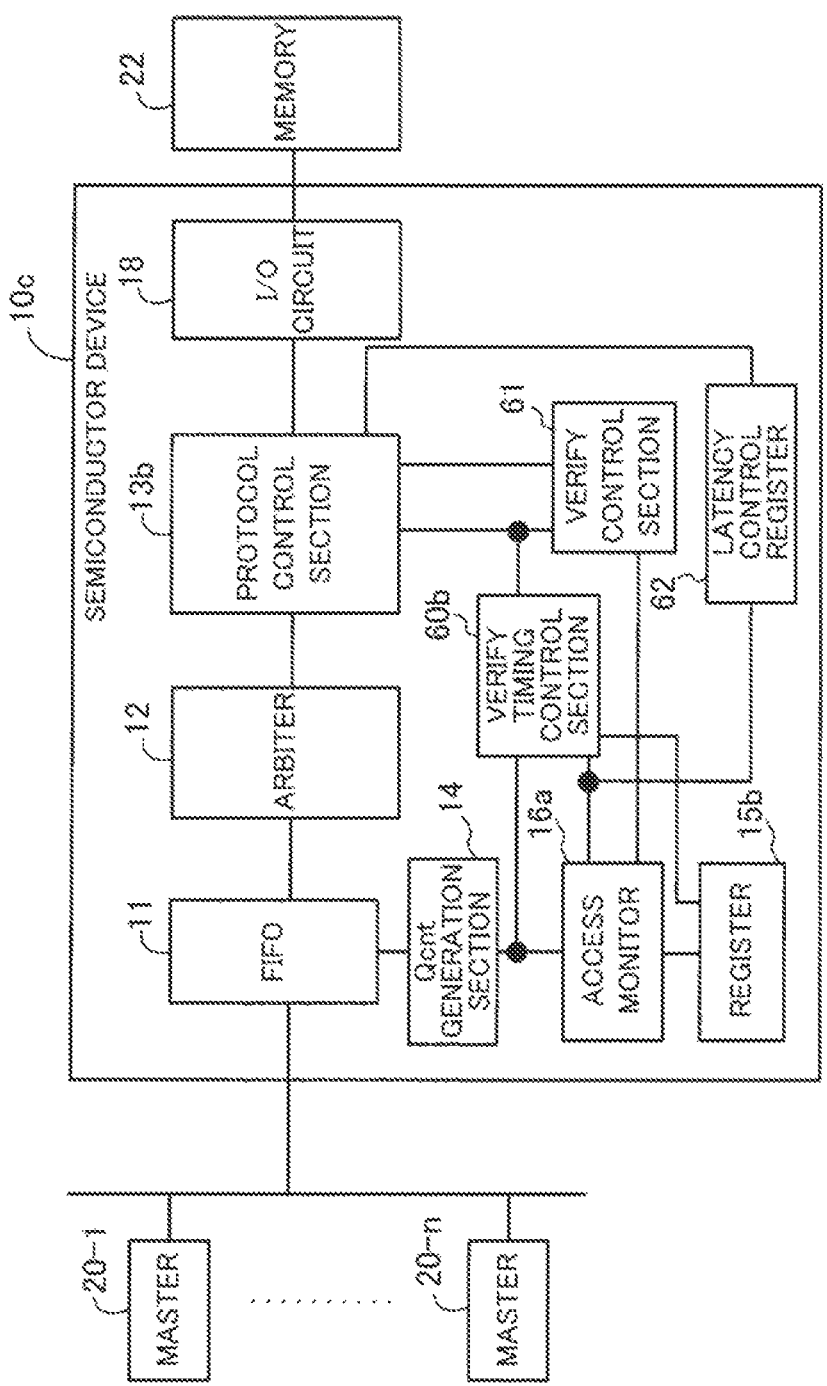
FIG. 26 indicates an example of a semiconductor device according to a fifth embodiment.

FIG. 26 indicates an example of a semiconductor device according to a fifth embodiment. Components in FIG. 26 which are the same as those included in the semiconductor device 10b according to the fourth embodiment illustrated in FIG. 19 are marked with the same numerals and description of them will be omitted.

A register 15b included in a semiconductor device 10c stores upper limit values STB_MAX and ACT_MAX. This is the same with the register 15 included in the semiconductor device 10 according to the second embodiment. An access monitor 16a uses the upper limit value STB_MAX. This is the same with the semiconductor device 10a according to the third embodiment and the semiconductor device 10b according to the fourth embodiment. A verify timing control section 60b uses the other upper limit value ACT_MAX.

(Example of Verify Timing Control Section 60b)

Figure 27:
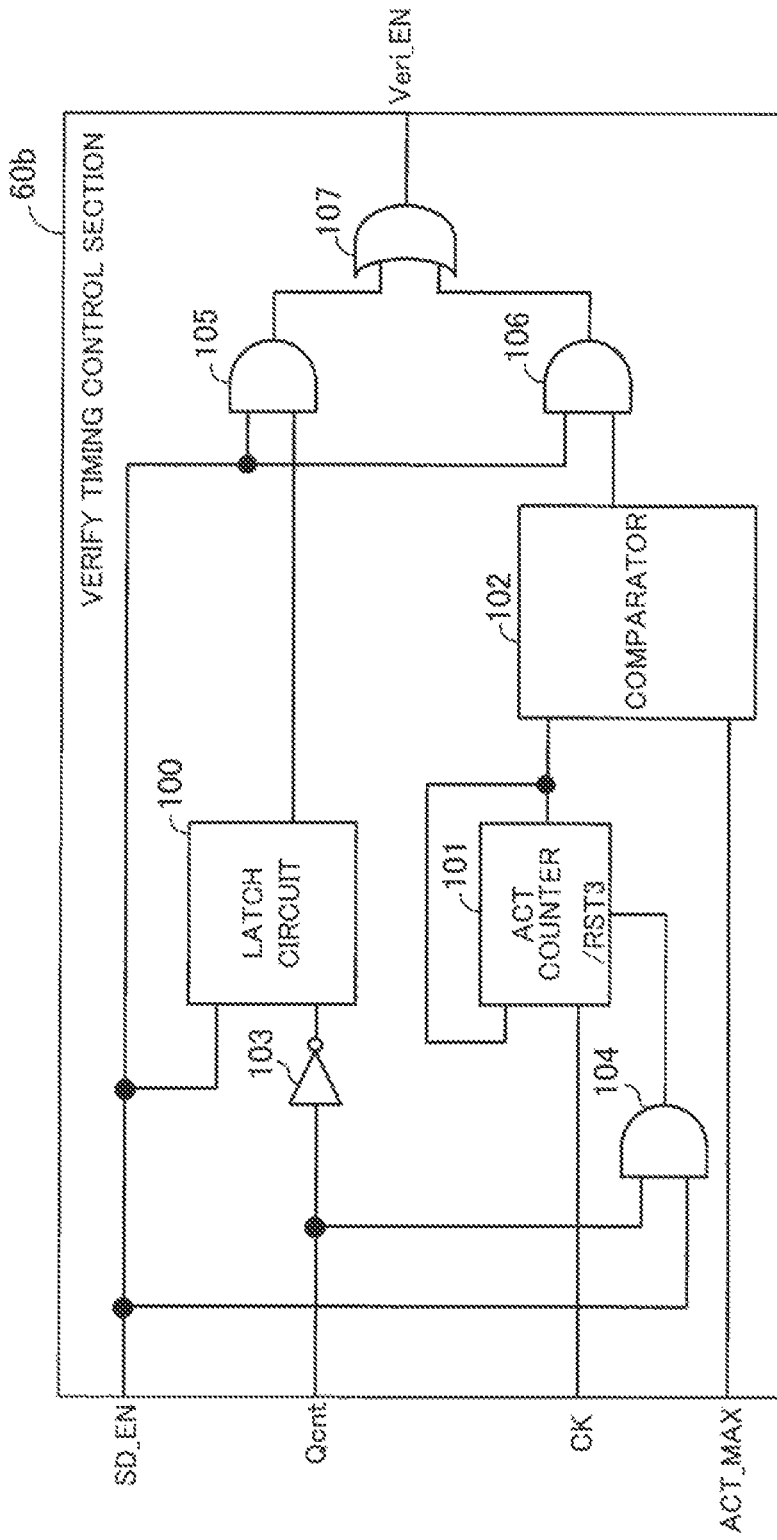
FIG. 27 indicates an example of a verify timing control section.

FIG. 27 indicates an example of the verify timing control section.

The verify timing control section 60b included in the semiconductor device 10c according to the fifth embodiment includes a latch circuit 100, an ACT counter 101, a comparator 102, an inverter 103, AND circuits 104, 105, and 106, and an OR circuit 107.

The latch circuit 100 receives a signal Qcnt via the inverter 103. When the signal Qcnt is "0", the latch circuit 100 accepts a value of a signal SD_EN. the signal SD_EN is inputted to one input terminal of the AND circuit 105 and a signal outputted from the latch circuit 100 is inputted to the other input terminal of the AND circuit 105. An output terminal of the AND circuit 105 is connected to one input terminal of the OR circuit 107.

The ACT counter 101 performs count in synchronization with a clock signal CK. Furthermore, the ACT counter 101 includes a reset terminal /RST3.

The comparator 102 compares a count value ACT outputted from the ACT counter 101 and the upper limit value ACT_MAX supplied from the register 15b. If the count value ACT outputted from the ACT counter 101 is greater than or equal to the upper limit value ACT_MAX, then the comparator 102 outputs "1". If the count value ACT is smaller than the upper limit value ACT_MAX, then the comparator 102 outputs "0".

The signal Qcnt is inputted to one input terminal of the AND circuit 104 and the signal SD_EN is inputted to the other input terminal of the AND circuit 104. An output terminal of the AND circuit 104 is connected to the reset terminal /RST3 of the ACT counter 101.

A signal outputted from the comparator 102 is inputted to one input terminal of the AND circuit 106 and the signal SD_EN is inputted to the other input terminal of the AND circuit 106. An output terminal of the AND circuit 106 is connected to the other input terminal of the OR circuit 107. A signal Veri_EN outputted from the verify timing control section 60b is outputted from an output terminal of the OR circuit 107.

When a memory 22 is in a low power consumption operation state (SD_EN=1) and access to the memory 22 is interrupted (Qcnt=0), the verify timing control section 60b having the above structure makes the signal Veri_EN "1" and verify is performed. Furthermore, when the memory 22 is in a low power consumption operation state, an access period (period for which the signal Qcnt is "1") lasts for a determined period, and the count value ACT of the ACT counter 101 reaches the upper limit value ACT_MAX, the signal Veri_EN becomes "1" and verify is performed.

(Example of Operation of Whole of Semiconductor Device 10c According to Fifth Embodiment)

Figure 28:
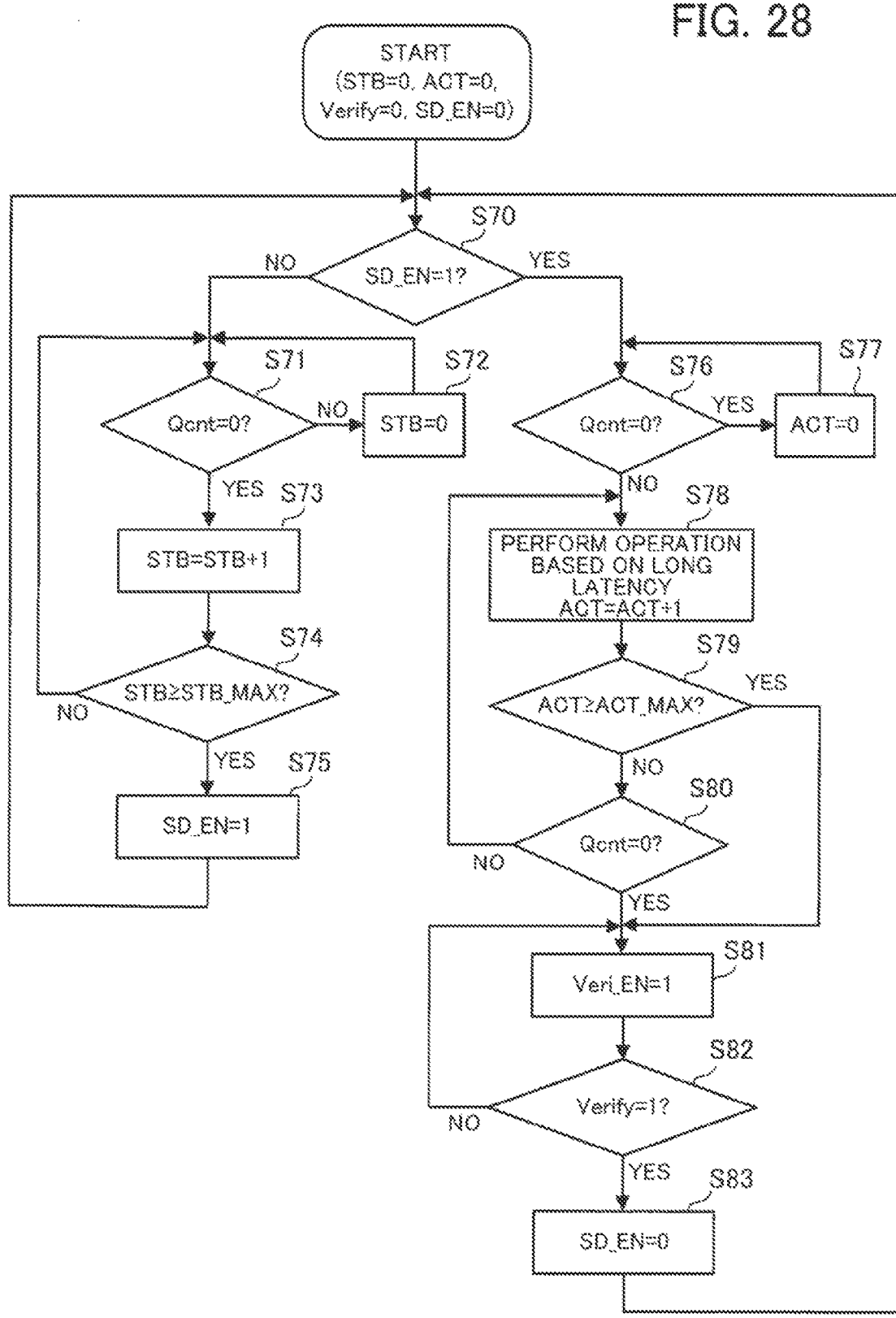
FIG. 28 is a flow chart of an example of the operation of the semiconductor device according to the fifth embodiment.

FIG. 28 is a flow chart of an example of the operation of the semiconductor device according to the fifth embodiment.

It is assumed that count values STB and ACT, a signal SD_EN, and a verify result Verify are "0" at first. Furthermore, it is assumed that a signal INITx is "0".

Steps S70, S71, S72, S73, S74, and S75 are the same as steps S50 through S55, respectively, indicated in FIG. 24, so description of them will be omitted.

If the signal SD_EN is "1" at the time of performing step S70, then an access monitor 16a determines in step S76 whether or not a signal Qcnt is "0". When access to the memory 22 does not occur and a FIFO 11 is in an empty state, the signal Qcnt is "0" and the ACT counter 101 is reset. As a result, the count value ACT outputted from the ACT counter 101 becomes "0" (step S77) and a process is repeated from step S76. Furthermore, if the signal SD_EN is "1", then a latency control register 62 makes a low power consumption operation latency register 82 valid and, as stated above, outputs latency ltrc, ltras, and ltrcd which are longer than latency ltrc, ltras, and ltrcd, respectively, at normal operation time.

When a command is supplied to the FIFO 11 and access to the memory 22 occurs, the signal Qcnt becomes "1" and operation based on the latency ltrc, ltras, and ltrcd which are longer than the latency ltrc, ltras, and ltrcd, respectively, at normal operation time is performed (step S78). At this time the count value ACT is incremented in synchronization with a clock signal CK.

The verify timing control section 60b determines whether or not the count value ACT is greater than or equal to the upper limit value ACT_MAX (step S79) and determines whether or not the signal Qcnt is "0" (step S80). If the count value ACT is greater than or equal to the upper limit value ACT_MAX or if the signal Qcnt is "0", then the verify timing control section 60b makes a signal Veri_EN "1" (step S81). As a result, the above verify is performed. If the count value ACT is smaller than the upper limit value ACT_MAX and the signal Qcnt is "1", then a process is repeated from step S78.

The access monitor 16a then determines whether or not the verify result Verify transmitted thereto from a verify control section 61 is "1" (step S82). If the verify result Verify is "0", then a process is repeated from step S81. If the verify result Verify is "1", then the access monitor 16a makes the signal SD_EN "0" (step S83). As a result, the verify by the verify control section 61 ends. The latency control register 62 makes a normal operation latency register 81 valid and, as stated above, outputs the normal operation latency ltrc, ltras, and ltrcd. After that, a process is repeated from step S70 until, for example, the supply of power is stopped.

Figure 29:
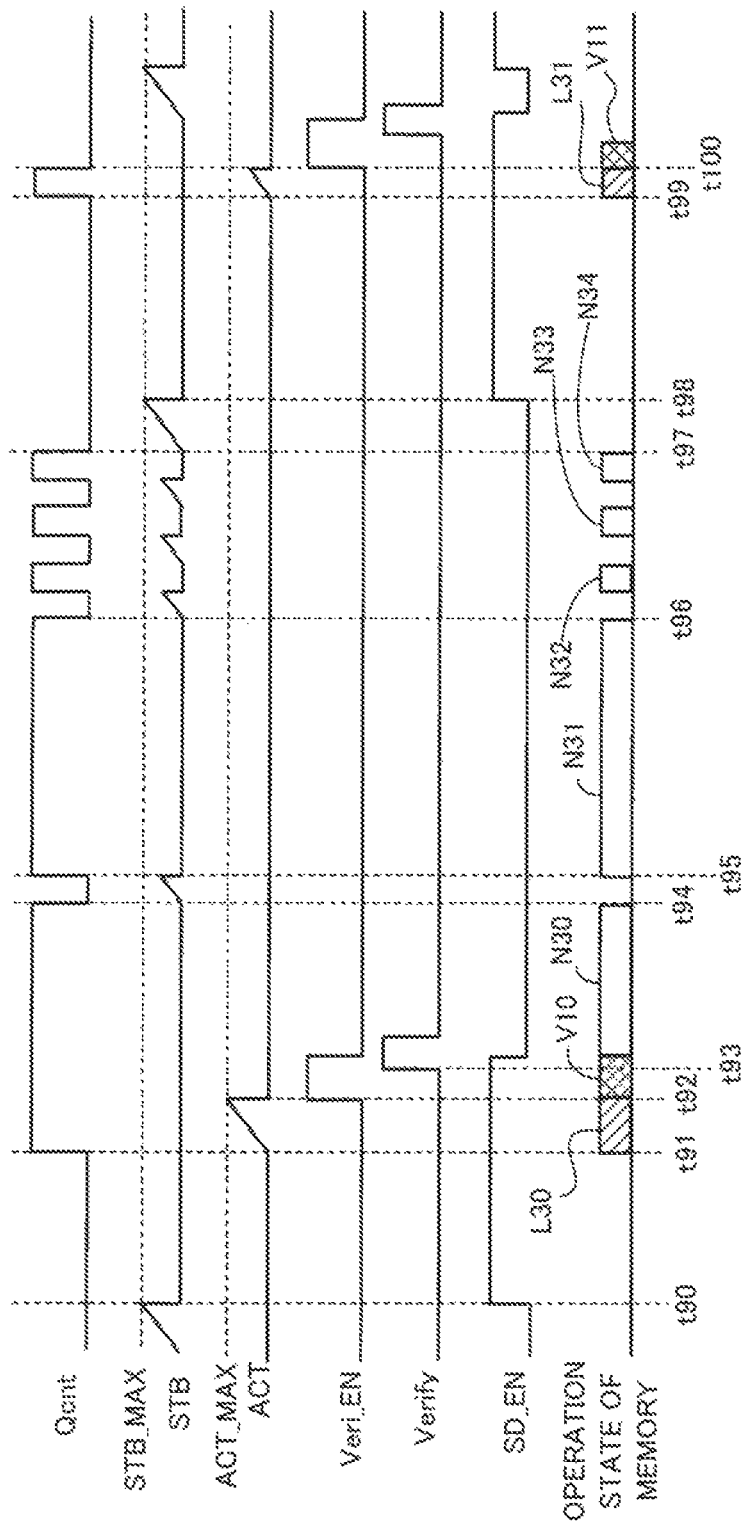
FIG. 29 is a timing chart of an example of the operation of the semiconductor device according to the fifth embodiment.

FIG. 29 is a timing chart of an example of the operation of the semiconductor device according to the fifth embodiment. FIG. 29 indicates examples of a signal Qcnt, count values STB and ACT, a signal Veri_EN, a verify result Verify, a signal SD_EN, and an operation state of the memory 22. A clock signal CK is not indicated.

When the signal Qcnt is "0" in a state in which the signal SD_EN is "0", an STB counter 31 performs count-up operation in synchronization with the clock signal CK. When the count value STB reaches the upper limit value STB_MAX, the signal SD_EN becomes "1" (at timing t90). When the signal Qcnt becomes "1" in a state in which the signal SD_EN is "1", the memory 22 goes into a state L30 in which operation based on latency ltrc, ltras, and ltrcd which are longer than latency ltrc, ltras, and ltrcd, respectively, at normal operation time is performed (at timing t91).

When the signal Qcnt becomes "1", the ACT counter 101 included in the verify timing control section 60b performs count-up operation in synchronization with the clock signal CK. When the count value ACT reaches the upper limit value ACT_MAX (at timing t92), the signal Veri_EN becomes "1" and the memory 22 goes into a state V10 in which verify is performed.

When the verify result Verify becomes "1" (at timing t93), the signal SD_EN becomes "0" and the memory 22 goes into a state N30 in which normal operation based on the normal operation latency ltrc, ltras, and ltrcd is performed.

As indicated in FIG. 29, the signal Qcnt becomes "0" at timing t94. However, the signal Qcnt returns to "1" at timing t95 at which the count value STB does not reach the upper limit value STB_MAX. Accordingly, the signal SD_EN remains at "0". As a result, the memory 22 goes again into a state N31 in which normal operation is performed at timing t95 at which access occurs.

The signal Qcnt frequently becomes "0" and "1" from timing t96 to timing t97. However, the count value STB does not reach the upper limit value STB_MAX, so the signal SD_EN remains at "0". Accordingly, while the signal Qcnt is "1", the memory 22 is in states N32, N33, and N34 in which normal operation based on the normal operation latency ltrc, ltras, and ltrcd is performed.

When the count value STB reaches the upper limit value STB_MAX in a state in which the signal Qcnt is "0", the signal SD_EN becomes "1" (at timing t98). As a result, at timing t99 at which the signal Qcnt becomes "1", the memory 22 goes into a state L31 in which operation based on the latency ltrc, ltras, and ltrcd which are longer than the latency ltrc, ltras, and ltrcd, respectively, at normal operation time is performed.

When the signal Qcnt becomes "0" again in a state in which the signal SD_EN is "1", the signal Veri_EN becomes "1" and the memory 22 goes into a state V11 in which verify is performed.

With the above semiconductor device 10c the same effects that are obtained by the semiconductor device 10b according to the fourth embodiment are achieved. In addition, when the signal SD_EN is "1" and a state in which the signal Qcnt is "1" continues for a determined period, it is possible to perform verify and make the memory 22 make a transition to a normal operation state. That is to say, even when access is not interrupted in a state in which low power consumption operation is permitted, verify can be performed. Therefore, the memory 22 can rapidly make a transition to a normal operation state.

By the way, methods for realizing a low power consumption operation state are not limited to those described above. The method of making the number of circuits which operate at a time smaller than the number of circuits which operate at a time in a normal operation state may be adopted. Three examples of this method will now be described as modifications 1, 2, and 3.

(Modification 1)

Figure 30:
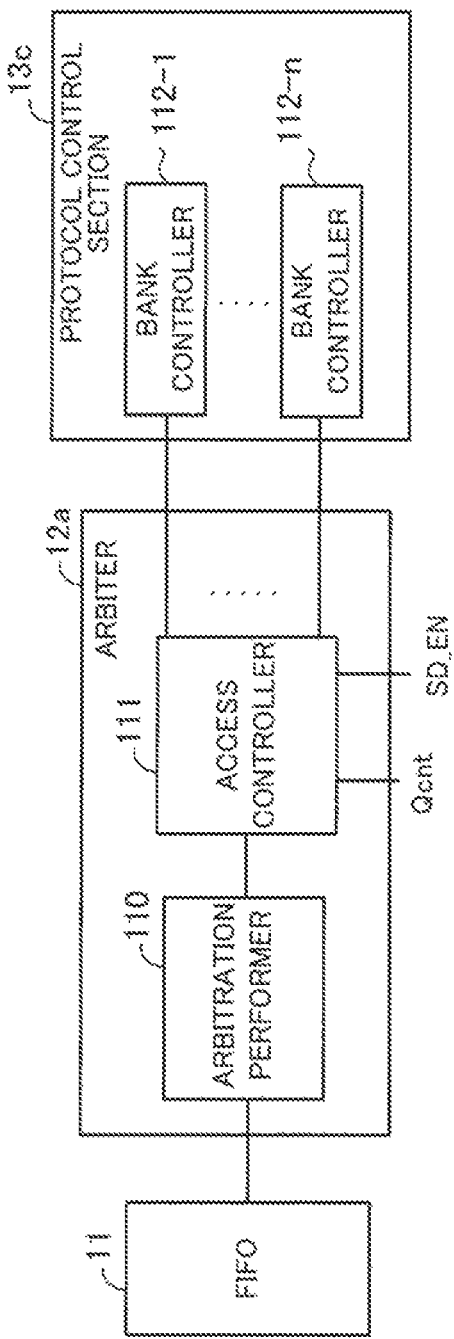
FIG. 30 illustrates modification 1 of a semiconductor device.

FIG. 30 illustrates modification 1 of a semiconductor device. Components in FIG. 30 which are the same as those included in the semiconductor device 10 illustrated in FIG. 2 are marked with the same numerals. Furthermore, the Qcnt generation section 14, the access monitor 16, and the like illustrated in FIG. 2 are not illustrated in FIG. 30.

With modification 1 an arbiter 12a includes an arbitration performer 110 which performs arbitration and an access controller 111. A protocol control section 13c includes a plurality of (n) bank controllers 112-1 through 112-n.

The bank controllers 112-1 through 112-n control n banks in a memory (not illustrated).

When the arbitration performer 110 makes an access request, the access controller 111 permits or restricts access to a bank according to a signal SD_EN supplied from an access monitor 16 and a signal Qcnt supplied from a Qcnt generation section 14.

When the signal SD_EN is "1", the access controller 111 realizes low power consumption operation by restricting operation (multibank operation) using a plurality of banks at the same time.

Figure 31:
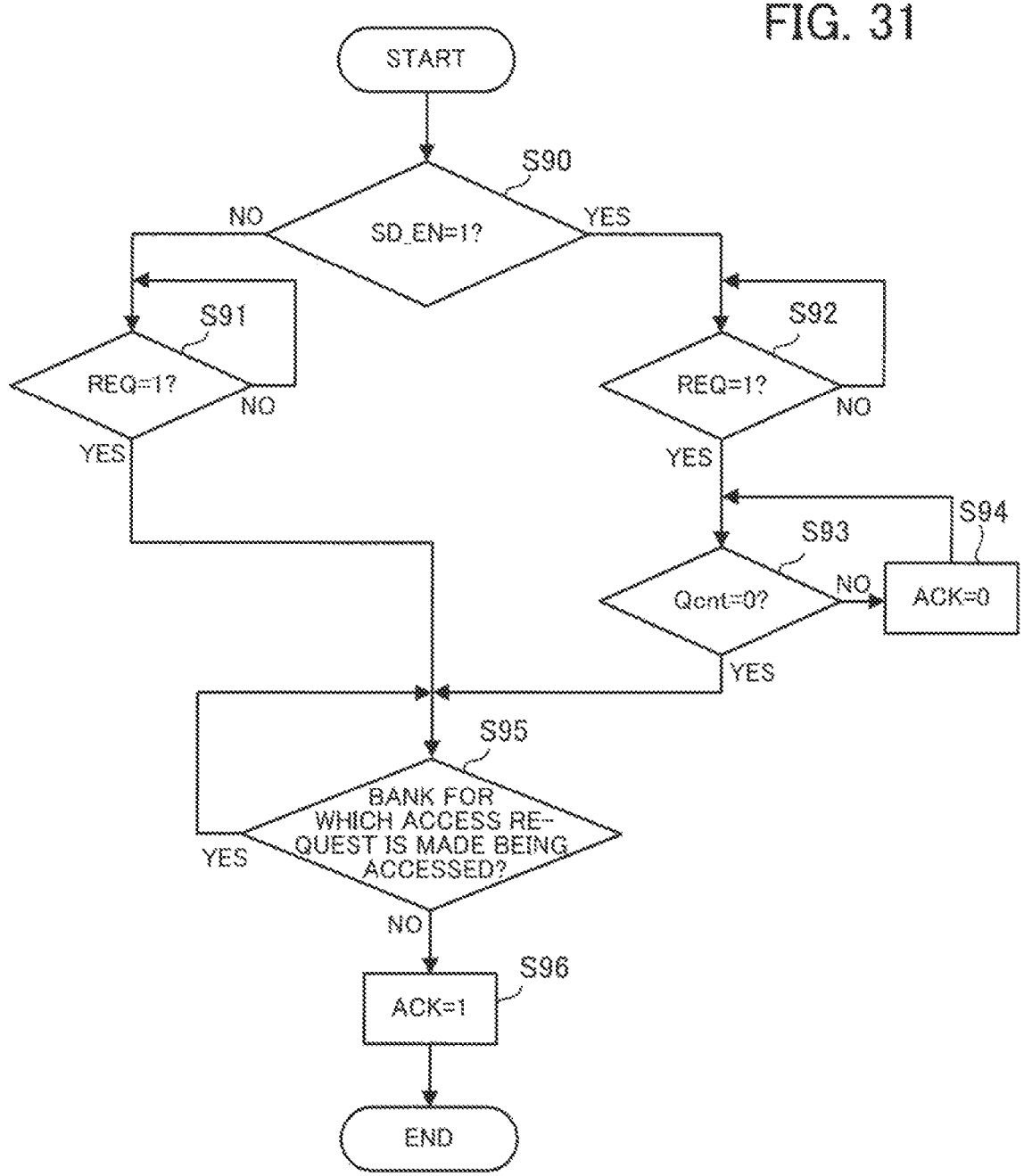
FIG. 31 is a flow chart of an example of the operation of modification 1 of a semiconductor device.

FIG. 31 is a flow chart of an example of the operation of modification 1 of a semiconductor device.

First the access controller 111 determines whether or not a signal SD_EN is "1" (step S90). If the signal SD_EN is "0", then the access controller 111 determines whether or nor the arbitration performer 110 makes an access request (whether or not REQ is "1") (step S91). If REQ is "1", then the access controller 111 performs step S95. If the arbitration performer 110 does not make an access request (REQ is "0"), then the access controller 111 repeats step S91 until REQ becomes "1".

On the other hand, if the signal SD_EN is "1", then the access controller 111 determines whether or not REQ is "1" (step S92). If REQ is "1", then the access controller 111 performs step S93. If REQ is "0", then the access controller 111 repeats step S92 until REQ becomes "1".

The access controller 111 determines in step S93 whether or not a signal Qcnt is "0". If a command is supplied to a FIFO 11 and the signal Qcnt is "1", then the access controller 111 informs the arbitration performer 110 of a signal (ACK=0) to the effect that access is not permitted (step S94). Until the FIFO 11 becomes empty and the signal Qcnt becomes "0", the access controller 111 then repeats step S93. If the signal Qcnt is "0", then step S95 is performed.

The access controller 111 determines in step S95 whether or not a bank for which the access request is made is being accessed. If the bank for which the access request is made is being accessed, then the access controller 111 repeats step S95. If the bank for which the access request is made is not being accessed, then the access controller 111 makes ACK "1" and permits access to the bank (step S96).

Figure 32:
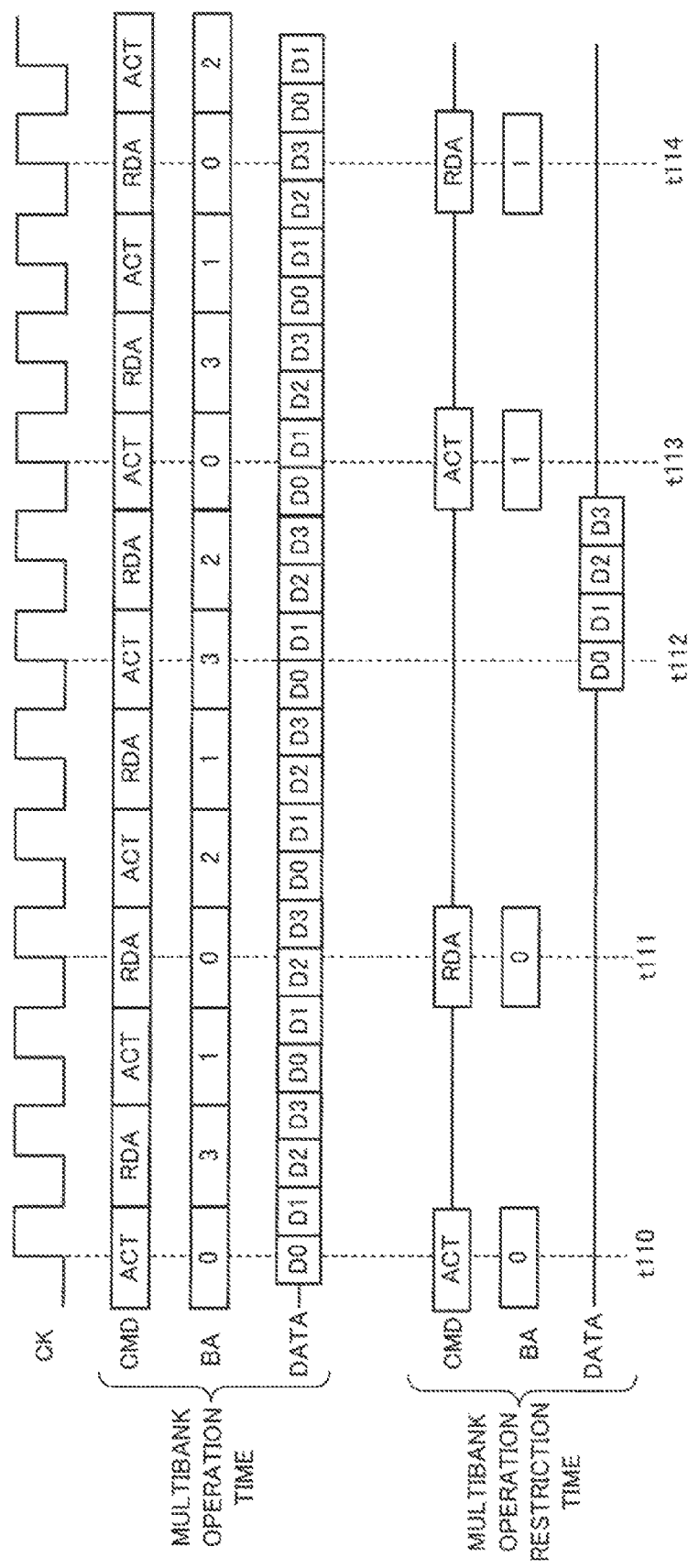
FIG. 32 is a timing chart of an example of operation at multibank operation time and multibank operation restriction time.

FIG. 32 is a timing chart of an example of operation at multibank operation time and multibank operation restriction time. FIG. 32 indicates examples of a clock signal CK, a command CMD, selected bank (BA) number, and data read out.

At the multibank operation time, active commands ACT and read commands RDA for different banks are issued as commands CMD according to cycles of the clock signal CK and data D0 through D3 is read out from each bank one by one.

At the multibank operation restriction time, on the other hand, one bank is accessed at a time. For example, an active command ACT is issued to bank #0 at timing t110, a read command RDA is issued to bank #0 at timing t111, and data D0 through D3 is read out from timing t112.

Furthermore, an active command ACT is issued to bank #1 at timing t113 and a read command RDA is issued to bank #1 at timing t114.

The access controller 111 limits in this way the number of banks accessed at a time. This reduces the power consumption of the memory. In addition, peak current can be decreased by separating a RAS current and a CAS (Column Address Strobe) current. As a result, low power consumption operation is realized.

(Modification 2)

Figure 33:
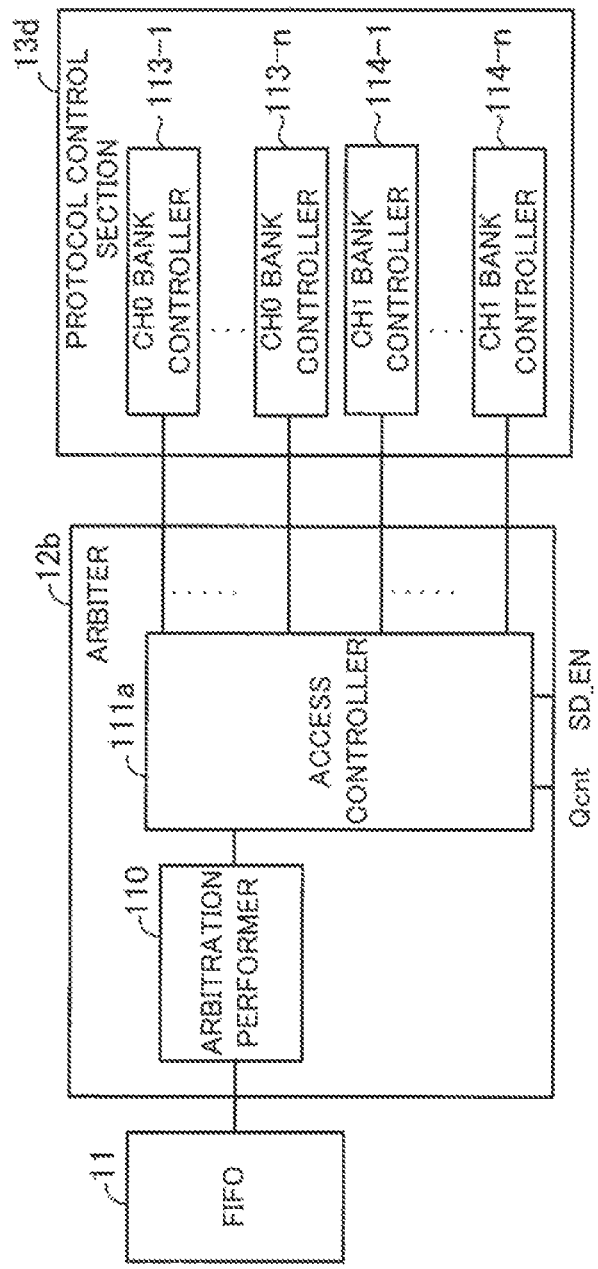
FIG. 33 illustrates modification 2 of a semiconductor device.

FIG. 33 illustrates modification 2 of a semiconductor device. Components in FIG. 33 which are the same as those included in the semiconductor device 10 illustrated in FIG. 2 are marked with the same numerals. Furthermore, the Qcnt generation section 14, the access monitor 16, and the like illustrated in FIG. 2 are not illustrated in FIG. 33.

With modification 2 an arbiter 12b includes an arbitration performer 110 and an access controller 111a. A protocol control section 13d includes a plurality of (n) CH0 bank controllers 113-1 through 113-n and a plurality of (n) CH1 bank controllers 114-1 through 114-n for a plurality of (two, in the example of FIG. 33) channels.

The CH0 bank controllers 113-2 through 113-n control n banks in a channel CH0 of a memory (not illustrated). The CH1 bank controllers 114-1 through 114-n control n banks in a channel CH1 of the memory (not illustrated).

When the arbitration performer 110 makes an access request, the access controller 111a permits or restricts access to a channel according to a signal SD_EN supplied from an access monitor 16 and a signal Qcnt supplied from a Qcnt generation section 14.

In modification 2 it is assumed that signals Qcnt are supplied from the Qcnt generation section 14 according to channels. That is to say, if a command for a channel is supplied to a FIFO 11, then a signal Qcnt for the channel is "1".

When the signal SD_EN is "1", the access controller 111a realizes low power consumption operation by restricting operation (multichannel operation) using the plurality of channels at the same time.

Figure 34:
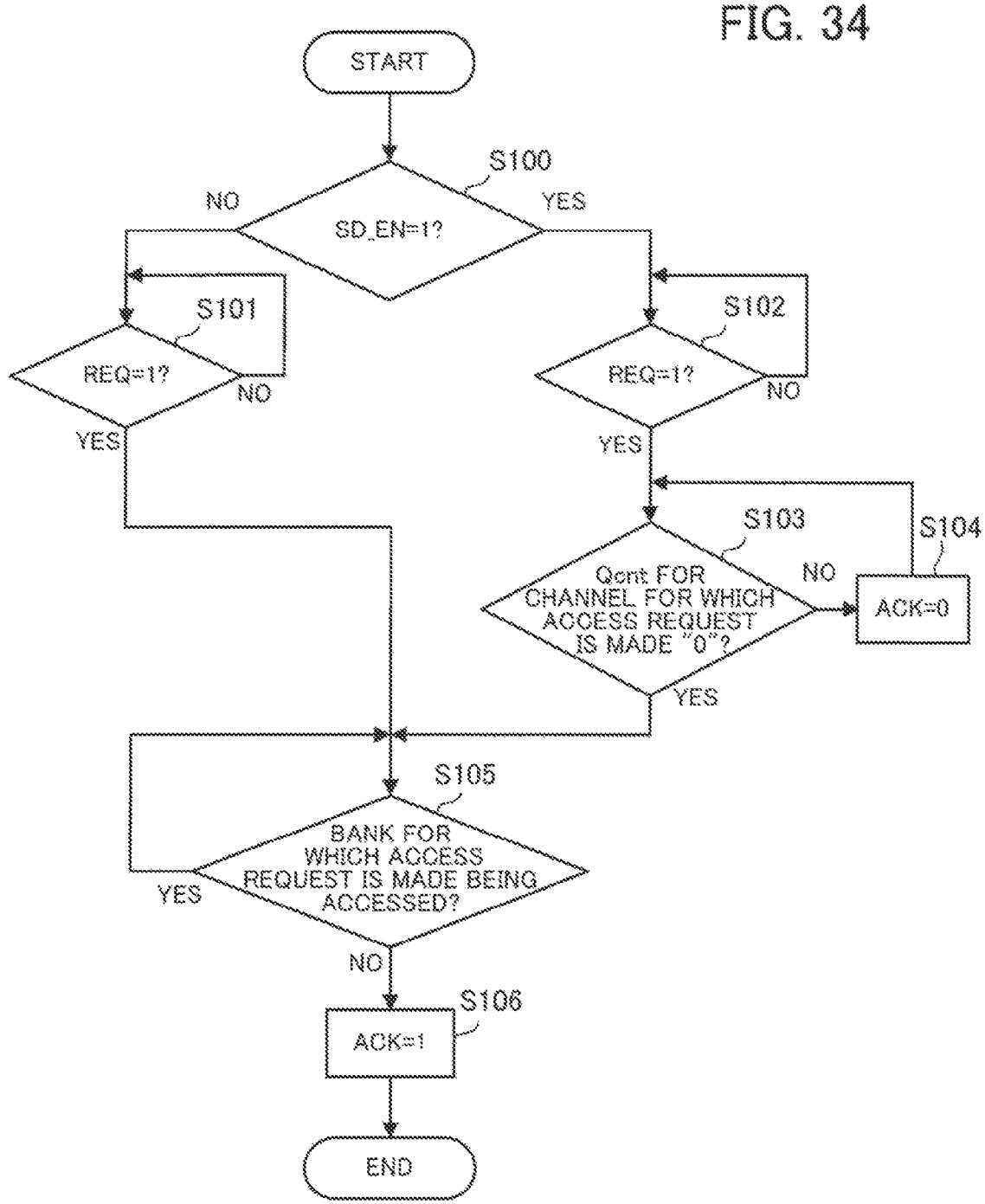
FIG. 34 is a flow chart of an example of the operation of modification 2 of a semiconductor device.

FIG. 34 is a flow chart of an example of the operation of modification 2 of a semiconductor device.

First the access controller 111a determines whether or not a signal SD_EN is "1" (step S100). If the signal SD_EN is "0", then the access controller 111a determines whether or not the arbitration performer 110 makes an access request (whether or not REQ is "1") (step S101). If REQ is "1", then the access controller 111a performs step S105. If the arbitration performer 110 does not make an access request (REQ is "0"), then the access controller 111a repeats step S101 until REQ becomes "1".

On the other hand, if the signal SD_EN is "1", then the access controller 111a determines whether or not REQ is "1" (step S102). If REQ is "1", then the access controller 111a performs step S103. If REQ is "0", then the access controller 111a repeats step S102 until REQ becomes "1".

The access controller 111a determines in step S103 whether or not a signal Qcnt for a channel for which the access request is made is "0". If a command for the channel is supplied to the FIFO 11 and the signal Qcnt is "1", then the access controller 111a informs the arbitration performer 110 of a signal (ACK=0) to the effect that access is not permitted (step S104). Until the FIFO 11 becomes empty and the signal Qcnt for the channel becomes "0", the access controller 111a then repeats step S103. If the signal Qcnt is "0", then step S105 is performed.

The access controller 111a determines in step S105 whether or not a bank in the channel for which the access request is made is being accessed. If the bank in the channel for which the access request is made is being accessed, then the access controller 111a repeats step S105. If the bank in the channel for which the access request is made is not being accessed, then the access controller 111a makes ACK "1" and permits access to the bank (step S106).

Figure 35:
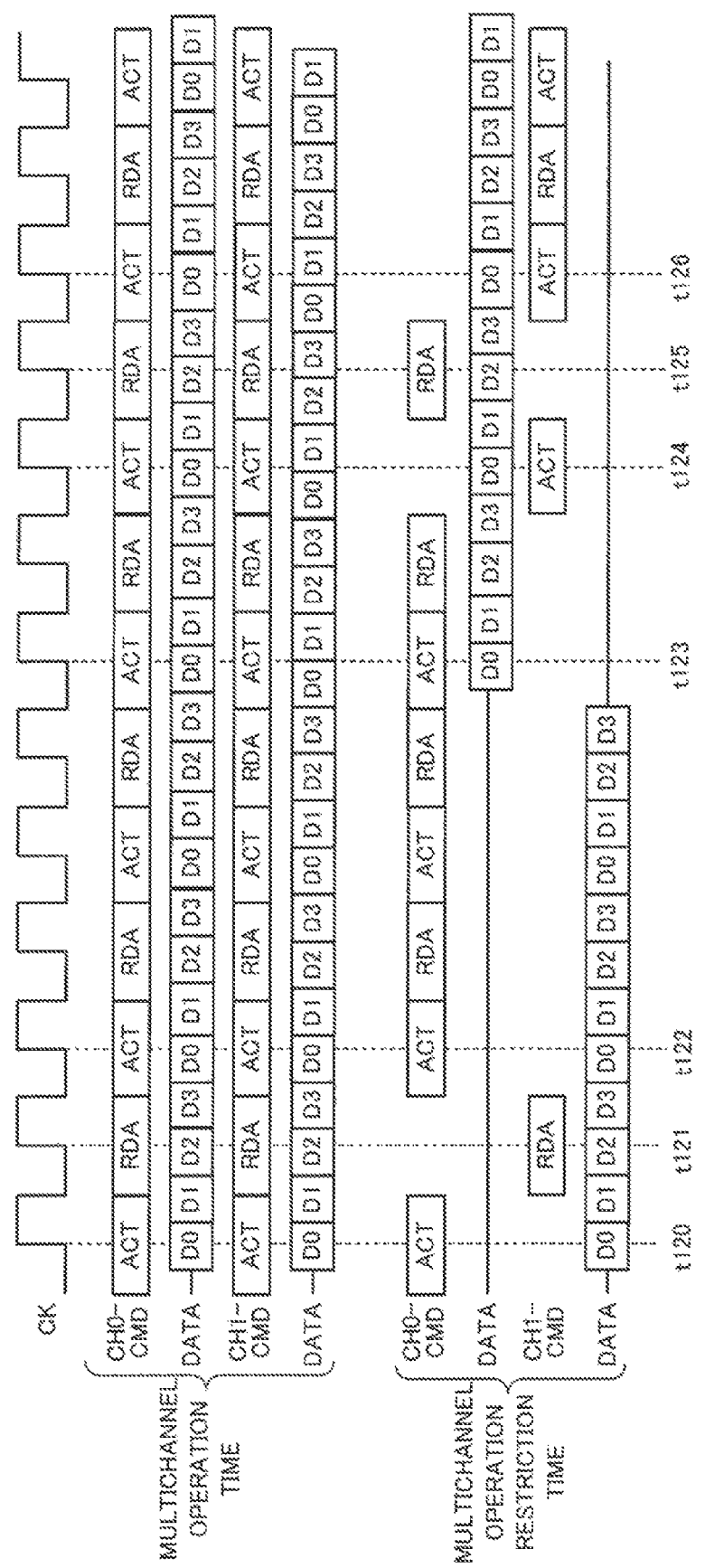
FIG. 35 is a timing chart of an example of operation at multichannel operation time and multichannel operation restriction time.

FIG. 35 is a timing chart of an example of operation at multichannel operation time and multichannel operation restriction time. FIG. 35 indicates examples of a clock signal CK, commands CH0-CMD and CH1-CMD for the channels, and data read out.

At the multichannel operation time, the commands CH0-CMD and CH1-CMD for the channels CH0 and CH1 are issued in parallel and data is read out in parallel.

At the multichannel operation restriction time, on the other hand, one channel is accessed at a time. For example, an active command ACT is issued to the channel CH0 at timing t120 and a read command RDA is issued to the channel CH1 at timing t121. Furthermore, an active command ACT is issued again to the channel CH0 at timing t122.

At timing t124, a command CH0-CMD is not issued to the channel CH0 and an active command ACT is issued to the channel CH1. At timing t125, a command CH1-CMD is not issued to the channel CH1 and a read command RDA is issued to the channel CH0. An active command ACT is issued again to the channel CH1 from timing t126.

Data D0 through D3 is read out from the channel CH1 from the timing t120 and data D0 through D3 is read out from the channel CH0 from timing t123.

The access controller 111a limits in this way the number of channels accessed at a time. As a result, the power consumption of the memory is reduced and low power consumption operation is realized.

(Modification 3)

Figure 36:
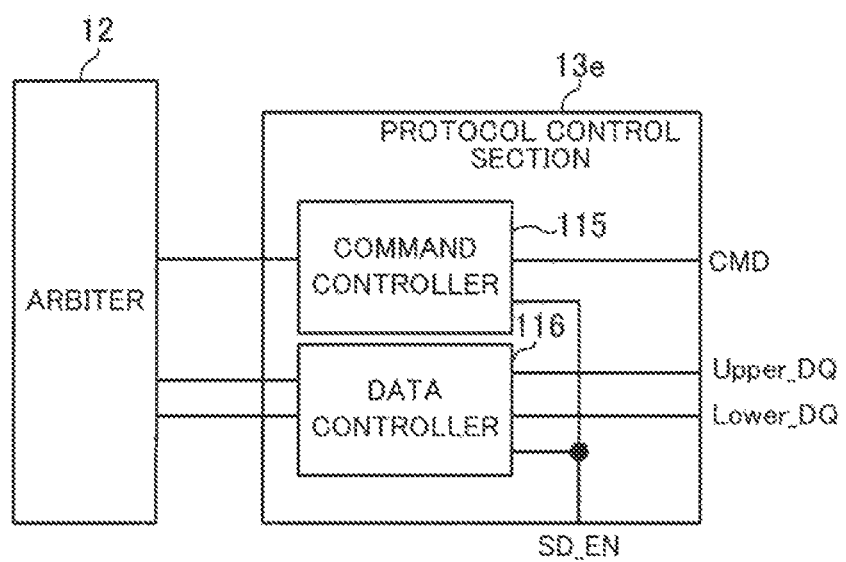
FIG. 36 illustrates modification 3 of a semiconductor device.

FIG. 36 illustrates modification 3 of a semiconductor device. Components in FIG. 36 which are the same as those included in the semiconductor device 10 illustrated in FIG. 2 are marked with the same numerals. Furthermore, the Qcnt generation section 14, the access monitor 16, and the like illustrated in FIG. 2 are not illustrated in FIG. 36.

With modification 3 a protocol control section 13e includes a command controller 115 and a data controller 136.

The command controller 115 receives via an arbiter 12 a command stored in a FIFO 11, and informs a memory (not illustrated) of the command in accordance with a protocol. In addition, when a signal SD_EN is "1", the command controller 115 supplies to the memory a command for upper order data bits Upper_DQ and a command for lower order data bits Lower_DQ.

The data controller 116 controls write timing of write data and read timing of read data in accordance with the protocol. In addition, when the signal SD_EN is "1", the data controller 116 reads or writes the upper order data bits Upper_DQ and the lower order data bits Lower_DQ at different timings.

Figure 37:
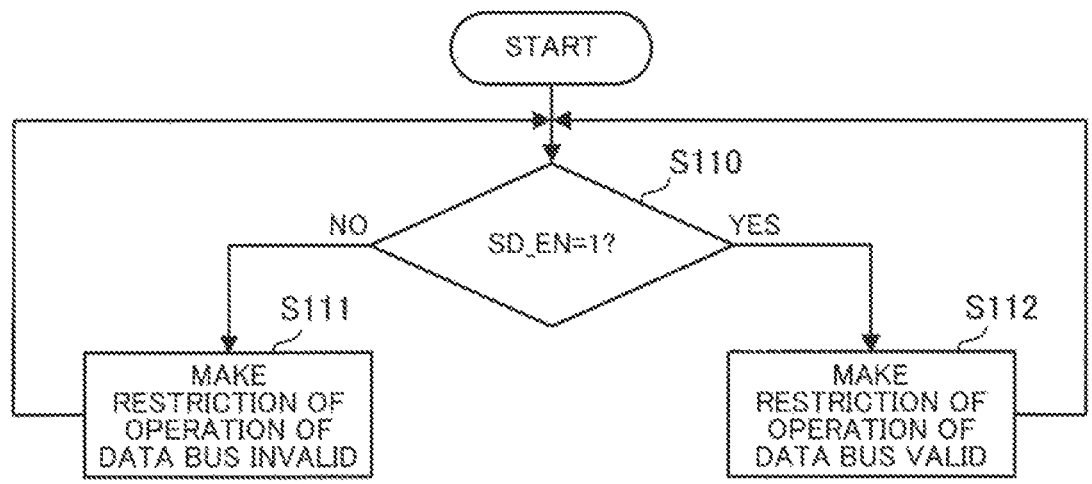
FIG. 37 is a flow chart of an example of the operation of modification 3 of a semiconductor device.

FIG. 37 is a flow chart of an example of the operation of modification 3 of a semiconductor device.

The command controller 115 and the data controller 116 determine whether or not a signal SD_EN is "1" (step S110). If the signal SD_EN is "0", then the command controller 115 and the data controller 116 make restriction of the operation of a data bus invalid (step S111). In this case, upper order data bits Upper_DQ and lower order data bits Lower_DQ are read or written at the same timing.

On the other hand, if the signal SD_EN is "1", then the command controller 115 and the data controller 116 make restriction of the operation of the data bus valid (step S112). In this case, the upper order data bits Upper_DQ and the lower order data bits Lower_DQ are read or written at different timings. For example, the upper order data bits Upper_DQ are accessed first and then the lower order data bits Lower_DQ are accessed.

After steps S111 and S112 are performed, a process is repeated from step S110 until, for example, the supply of power is stopped.

FIG. 38 is a timing chart of an example of operation at the time of restriction of the operation of the data bus being valid and invalid. FIG. 38 indicates examples of a clock signal CK, a command CMD, upper order data bits Upper_DQ, and lower order data bits Lower_DQ. FIG. 38 also indicates an example of the waveform of current consumed by the memory.

When restriction of the operation of the data bus is invalid and a read command RD, for example, is issued as a command CMD (at timing t130), the upper order data bits Upper_DQ and the lower order data bits Lower_DQ are read out at the same time from timing t132.

On the other hand, when restriction of the operation of the data bus is valid, read commands RD for the upper order data bits Upper_DQ and the lower order data bits Lower_DQ are issued at different timings (at the timing t130 and timing t131). The upper order data bits Upper_DQ are read out from the timing t132 and the lower order data bits Lower_DQ are read out from timing t133.

A current waveform I10 is obtained at the time of restriction of the operation of the data bus being invalid. A current waveform I11 is obtained at the time of restriction of the operation of the data bus being valid. As can be seen from FIG. 38, a peak value of the current waveform I11 is smaller than a peak value of the current waveform I10.

The command controller 115 and the data controller 116 restrict the operation of the data bus in this way. By doing so, low power consumption of the memory and low power consumption operation are realized during a determined period.

In the above description data bits on the data bus are divided in two, that is to say, into upper order data bits and lower order data bits. However, data bits on the data bus may be divided in three or more.

In addition, if a memory normally operates in DDR (Double Data Rate) mode, a semiconductor device may realize low power consumption operation by performing switching from the DDR mode to SDR (Single Data Rate) mode.

According to the disclosed semiconductor device and memory control method, the occurrence of a malfunction in an access object circuit can be prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
    an access detection circuit configured to detect access to an access object circuit and output a first signal which restricts switching of the access object circuit from a first operation state to a second operation state in which power consumption is lower than power consumption in the first operation state until a no-access period which lasts from last access to next access reaches a first period;
    an operation control circuit configured to control operation of the access object circuit according to an output of the access detection circuit; and
    a verification control circuit configured to perform verification on the access object circuit and inform the access detection circuit of a verification result,
    wherein when the access object circuit is in the second operation state, the access detection circuit is configured to output a second signal which restricts the switching of the access object circuit from the second operation state to the first operation state until the access detection circuit receives the verification result from the verification control circuit.

2. The semiconductor device according to claim 1, wherein, in the second operation state, the access object circuit is configured to operate with a clock signal whose cycle is longer than a cycle of a clock signal in the first operation state and driver capability which is lower than driver capability in the first operation state.

3. The semiconductor device according to claim 1, wherein the verification is performed on the access object circuit in the second operation state.

4. The semiconductor device according to claim 1, wherein a command is supplied to the access object circuit in the second operation state in a cycle which is longer than a cycle in which a command is supplied to the access object circuit in the first operation state.

5. The semiconductor device according to claim 1, wherein a number of circuits which operate at a time in the second operation state is smaller than a number of circuits which operate at a time in the first operation state.

6. The semiconductor device according to claim 1, wherein:
    the access object circuit comprises a memory including a plurality of banks; and
    a number of banks accessed at a time in the second operation state is smaller than a number of banks accessed at a time in the first operation state.

7. The semiconductor device according to claim 1, wherein:
    the access object circuit comprises a memory including a plurality of channels; and
    a number of channels accessed at a time in the second operation state is smaller than a number of channels accessed at a time in the first operation state.

8. The semiconductor device according to claim 1, wherein a number of bits on a bus accessed at a time in the second operation state is smaller than a number of bits on the bus accessed at a time in the first operation state.

9. A memory control method comprising:
    detecting, by an access detection circuit, access to a memory;
    outputting, by the access detection circuit, a first signal which restricts switching of the memory from a first operation state to a second operation state in which power consumption is lower than power consumption in the first operation state until a no-access period which lasts from last access to next access reaches a first period;
    controlling, by an operation control circuit, operation of the memory according to the first signal;
    performing, by a verification control circuit, verification on the access object circuit;
    informing, by the verification control circuit, the access detection circuit of a verification result; and
    outputting, by the access detection circuit, a second signal which restricts the switching of the access object circuit from the second operation state to the first operation state until the access detection circuit receives the verification result from the verification control circuit when the access object circuit is in the second operation state.

* * * * *